(12) United States Patent
Kim

(10) Patent No.: US 12,556,111 B2
(45) Date of Patent: Feb. 17, 2026

(54) POWER GENERATOR WITH PARTIAL SINUSOIDAL WAVEFORM, PLASMA PROCESSING APPARATUS INCLUDING THE SAME AND METHOD OF MANUFACTURING SEMICONDUCTOR DEVICE USING THE SAME

(71) Applicant: Samsung Electronics Co., Ltd., Suwon-si (KR)

(72) Inventor: Hyuk Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 334 days.

(21) Appl. No.: 18/198,624

(22) Filed: May 17, 2023

(65) Prior Publication Data

US 2024/0128892 A1 Apr. 18, 2024

(30) Foreign Application Priority Data

Oct. 18, 2022 (KR) .................. 10-2022-0133864

(51) Int. Cl.
| | | |
|---|---|---|
| *H02M 1/088* | (2006.01) | |
| *H01J 37/24* | (2006.01) | |
| *H01J 37/32* | (2006.01) | |
| *H02M 7/48* | (2007.01) | |
| *H02M 7/539* | (2006.01) | |

(52) U.S. Cl.
CPC ........... *H02M 7/539* (2013.01); *H01J 37/241* (2013.01); *H01J 37/32174* (2013.01); *H02M 1/088* (2013.01); *H02M 7/4815* (2021.05)

(58) Field of Classification Search
CPC .... H02M 1/0058; H02M 7/539; H01J 37/241; H01J 37/321
See application file for complete search history.

(56) References Cited

U.S. PATENT DOCUMENTS

| | | |
|---|---|---|
| 9,787,218 B2 | 10/2017 | Yamagishi et al. |
| 9,870,898 B2 | 1/2018 | Jrakawa et al. |
| 10,192,721 B2 | 1/2019 | Kasai |
| 10,474,184 B2 | 11/2019 | Kim et al. |
| 11,049,693 B2 | 6/2021 | Shoeb et al. |
| 11,189,464 B2 | 11/2021 | Savas et al. |

(Continued)

FOREIGN PATENT DOCUMENTS

KR 1020180012060 A 2/2018

*Primary Examiner* — Patrick C Chen
(74) *Attorney, Agent, or Firm* — Muir Patent Law, PLLC

(57) ABSTRACT

A power generator with partial sinusoidal waveform includes a resonance module circuit and a pulse module circuit. The resonance module circuit includes a plurality of resonance control switches, and generates a first output voltage by selectively turning on and off the plurality of resonance control switches based on a plurality of resonance control signals. The pulse module circuit includes a plurality of pulse control switches, and generates a second output voltage by selectively turning on and off the plurality of pulse control switches based on a plurality of pulse control signals. The power generator generates a bias power based on the plurality of resonance control signals, the plurality of pulse control signals, the first output voltage and the second output voltage. The bias power has a non-sinusoidal voltage waveform during an entire time interval and a sinusoidal voltage waveform during a partial time interval.

19 Claims, 18 Drawing Sheets

(56) References Cited

U.S. PATENT DOCUMENTS

| | | | |
|---|---|---|---|
| 2019/0096636 A1* | 3/2019 | Nam | H01J 37/32128 |
| 2020/0219706 A1* | 7/2020 | Koshimizu | H01J 37/32724 |
| 2021/0043472 A1 | 2/2021 | Koshimizu et al. | |
| 2022/0006431 A1* | 1/2022 | Raymond | H03F 3/2178 |
| 2022/0117074 A1 | 4/2022 | Long et al. | |
| 2025/0046572 A1* | 2/2025 | Shoeb | H01J 37/32128 |

* cited by examiner

POWER GENERATOR WITH PARTIAL SINUSOIDAL WAVEFORM, PLASMA PROCESSING APPARATUS INCLUDING THE SAME AND METHOD OF MANUFACTURING SEMICONDUCTOR DEVICE USING THE SAME

CROSS-REFERENCE TO RELATED APPLICATION

This application claims priority under 35 USC § 119 to Korean Patent Application No. 10-2022-0133864 filed on Oct. 18, 2022 in the Korean Intellectual Property Office (KIPO), the contents of which are herein incorporated by reference in their entirety.

BACKGROUND

1. Technical Field

Example embodiments relate generally to semiconductor integrated circuits, and more particularly to power generators with partial sinusoidal waveform, plasma processing apparatuses including the power generators, and/or methods of manufacturing semiconductor devices using the plasma processing apparatuses.

2. Description of the Related Art

Various types of semiconductor devices are manufactured using various plasma-based etching techniques. For example, a plasma etching apparatus such as an inductively coupled plasma (ICP) etching apparatus may generate plasma within a chamber to perform an etching process.

Semiconductor manufacturing processes using plasma rely on effective plasma control to achieve desired/requisite quality and/or manufacturing objectives. With a typical plasma based semiconductor process, radio frequency (RF) power of two different frequencies is used to independently control ion energy and plasma density, respectively. In addition, as patterns of semiconductor devices get smaller, uniformity control of the patterns may get more challenging. In order to improve etch uniformity between fine recess patterns in a cell region, a more precise plasma control may be beneficial.

SUMMARY

At least one example embodiment of the present disclosure provides a power generator with partial sinusoidal waveform capable of efficiently generating a bias power applied to a plasma processing apparatus.

At least one example embodiment of the present disclosure provides a plasma processing apparatus including the power generator and capable of efficiently improving plasma characteristics and etching performance.

At least one example embodiment of the present disclosure provides a method of manufacturing a semiconductor device using the plasma processing apparatus.

According to example embodiments, a power generator for generating a partial sinusoidal waveform includes a resonance module circuit and a pulse module circuit. The resonance module circuit includes a plurality of resonance control switches, and generates a first output voltage by selectively turning on and off the plurality of resonance control switches based on a plurality of resonance control signals. The pulse module circuit includes a plurality of pulse control switches, and generates a second output voltage by selectively turning on and off the plurality of pulse control switches based on a plurality of pulse control signals. The power generator generates a bias power based on the plurality of resonance control signals, the plurality of pulse control signals, the first output voltage and the second output voltage. The bias power has an overall periodic non-sinusoidal voltage waveform, and a sinusoidal voltage waveform during a partial time interval of each period of the non-sinusoidal voltage waveform.

According to example embodiments, a plasma processing apparatus includes a chamber, a substrate stage, an upper electrode, a sinusoidal power generator, and a power generator with partial sinusoidal waveform. The substrate stage supports a substrate within the chamber, and includes a lower electrode. The upper electrode is over the lower electrode to face the substrate. The sinusoidal power generator applies a plasma power to the upper electrode to form plasma within the chamber. The plasma power has a sinusoidal voltage waveform. The power generator applies a bias power to the lower electrode, and includes a resonance module circuit and a pulse module circuit. The resonance module circuit includes a plurality of resonance control switches, and generates a first output voltage by selectively turning on and off the plurality of resonance control switches based on a plurality of resonance control signals. The pulse module circuit includes a plurality of pulse control switches, and generates a second output voltage by selectively turning on and off the plurality of pulse control switches based on a plurality of pulse control signals. The power generator generates the bias power based on the plurality of resonance control signals, the plurality of pulse control signals, the first output voltage and the second output voltage. The bias power has an overall periodic non-sinusoidal voltage waveform, and a sinusoidal voltage waveform during a partial time interval of each period of the non-sinusoidal voltage waveform.

According to example embodiments, a power generator for generating a partial sinusoidal waveform includes a resonance module circuit, a pulse module circuit and a control signal generator. The resonance module circuit includes a first resonance control switch, an inductor, a second resonance control switch and a capacitor, and generates a first output voltage by selectively turning on and off the first resonance control switch and the second resonance control switch based on a first resonance control signal and a second resonance control signal, respectively. The first resonance control switch, the inductor and the second resonance control switch are connected between a first node and an output node. The capacitor is connected to the inductor. The pulse module circuit includes a first pulse control switch and a second pulse control switch that are connected to the output node, and generates a second output voltage by selectively turning on and off the first pulse control switch and the second pulse control switch based on a first pulse control signal and a second pulse control signal, respectively. The control signal generator generates the first resonance control signal, the second resonance control signal, the first pulse control signal and the second pulse control signal. The power generator generates a bias power based on the first resonance control signal, the second resonance control signal, the first pulse control signal, the second pulse control signal, the first output voltage and the second output voltage. The bias power has a non-sinusoidal voltage waveform during an entire time interval and a sinusoidal voltage waveform during a partial time interval of the entire time interval. The bias power has a voltage waveform that repeats every period. The period includes a ramp interval in which the bias power has a variable voltage level that is equal to or lower than a reference voltage level and decreases according to the sinusoidal voltage waveform, a pulse interval in which the bias power has a fixed voltage level that is higher than the reference voltage level, a first transition interval for changing the ramp interval to the pulse interval, and a second transition interval for changing the pulse interval to the ramp interval.

According to example embodiments, in a method of manufacturing a semiconductor device, plasma processing is performed on a substrate. The semiconductor device is fabricated using the substrate on which the plasma processing is performed. When performing the plasma processing on the substrate, the substrate is loaded onto a lower electrode within a chamber. A plasma power is applied, by a sinusoidal power generator, to an upper electrode to form plasma within the chamber. The plasma power has a sinusoidal voltage waveform. A bias power is applied, by a power generator with partial sinusoidal waveform, to the lower electrode. When applying the bias power to the lower electrode, a first output voltage is generated by selectively turning on and off a plurality of resonance control switches based on a plurality of resonance control signals. A second output voltage is generated by selectively turning on and off a plurality of pulse control switches based on a plurality of pulse control signals. The bias power is generated based on the plurality of resonance control signals, the plurality of pulse control signals, the first output voltage and the second output voltage. The bias power has an overall non-sinusoidal voltage waveform, and a sinusoidal voltage waveform during a partial time interval of each period of the non-sinusoidal voltage waveform.

The power generator with partial sinusoidal waveform according to example embodiments may be implemented with a structure for generating the bias power which has a non-sinusoidal voltage waveform during an entire time interval and a sinusoidal voltage waveform during a partial time interval. For example. during the ramp interval, the voltage level of the bias power may decrease according to the sinusoidal voltage waveform without decreasing linearly. Accordingly, the bias power may increase as much as desired without excessive heat generation, and the high-output power generator may be efficiently implemented.

The plasma processing apparatus according to example embodiments may include the power generator with partial sinusoidal waveform according to some example embodiments. Thus, the ion energy having a relatively narrow single peak may be formed, the etching profile of the semiconductor device may be improved, and/or bowing or loss of anisotropy may be reduced. Alternatively or additionally, the plasma density in the radial direction of the wafer may be controlled by the frequency change, and thus the etching distribution in the radial direction of the wafer may be controlled. Accordingly, the plasma characteristic and the etching performance may be efficiently improved.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
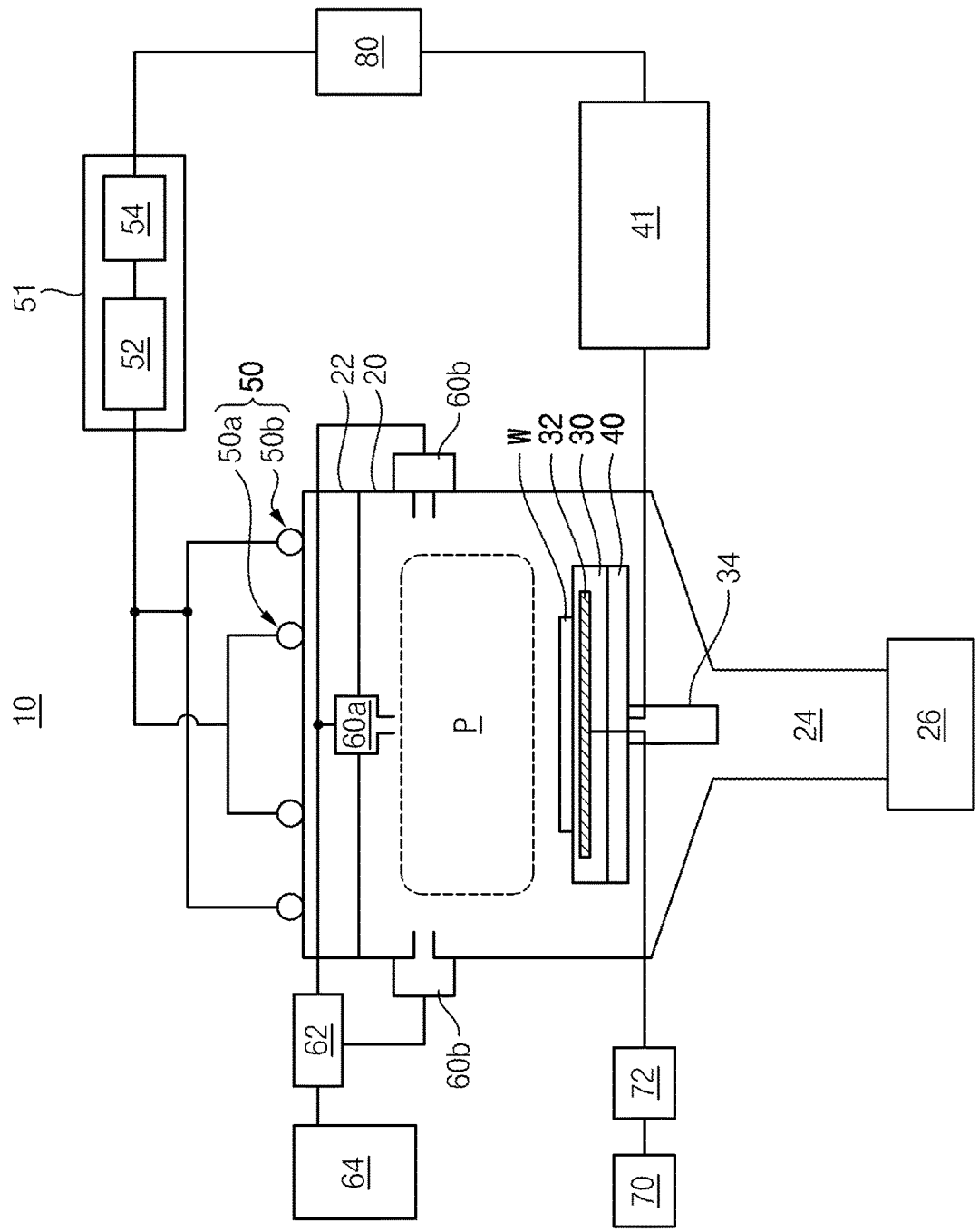
FIG. 1 is a block diagram illustrating a plasma processing apparatus according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

Figure 2:
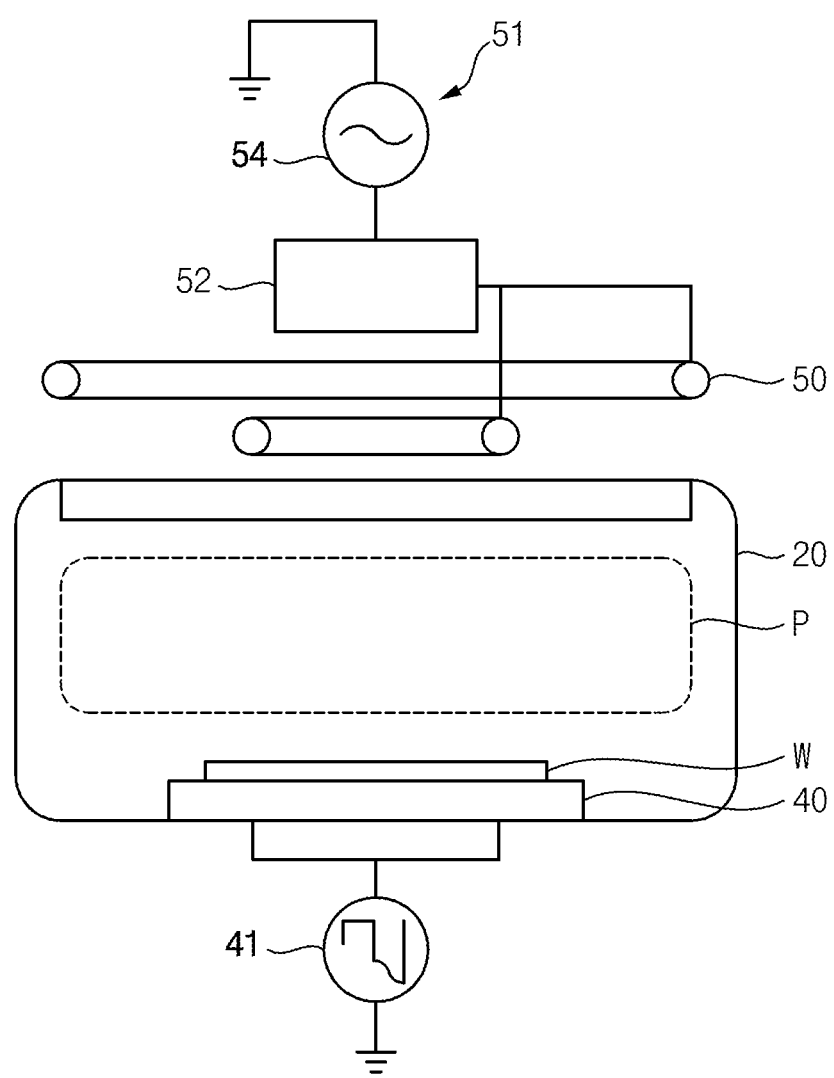
FIG. 2 is a diagram illustrating plasma generated within a chamber of a plasma processing apparatus in FIG. 1.

FIG. 1 is a block diagram illustrating a plasma processing apparatus according to example embodiments. FIG. 2 is a diagram illustrating plasma generated within a chamber of a plasma processing apparatus in FIG. 1.

Referring to FIGS. 1 and 2, a plasma processing apparatus 10 includes a chamber 20, a chuck or a substrate stage including a lower electrode 40, an upper electrode 50, a sinusoidal power generator 51, a power generator 41 with partial sinusoidal waveform, and a controller 80. The plasma processing apparatus 10 may further include other components such as a gas supply unit, a gas exhaust unit 26, etc.

In some example embodiments, the plasma processing apparatus 10 may be or may include an inductively coupled plasma (ICP) apparatus configured to etch a layer (e.g., an object layer) on a substrate W such as a semiconductor wafer that is disposed within the chamber 20. However, example embodiments are not limited thereto, and the plasma processing apparatus 10 may be or may include at least one of a capacitively coupled plasma (CCP) apparatus, a microwave plasma apparatus, etc. For example, plasma such as at least one of ICP, CCP, microwave plasma, etc., may be generated by the plasma processing apparatus 10. For example, the plasma processing apparatus 10 may include one or more of each of or at least two of an ICP chamber, a CCP chamber, and a microwave plasma chamber, which include different components from each other. Alternatively or additionally, the plasma processing apparatus 10 may not be limited to the etching apparatus, and for example, the plasma processing apparatus 10 may be or may include at least one of a deposition apparatus (e.g. a chemical vapor deposition (CVD) apparatus), a cleaning apparatus (e.g. an ashing apparatus), etc. Alternatively or additionally, the substrate W may include a semiconductor substrate such as a wafer, a glass substrate, etc.

The chamber 20 may provide a sealed space where a plasma etching process is performed on the substrate W. For example, the chamber 20 may be or may include a cylindrical vacuum chamber. For example, the chamber 20 may include or be formed of a metal such as at least one of aluminum, stainless steel, etc.

The substrate stage may be disposed or arranged within the chamber 20 to support the substrate W. For example, the substrate stage may serve as a susceptor for supporting the substrate W thereon. The substrate stage may include a chuck such as an electrostatic chuck 30 for holding the substrate W using electrostatic force. The substrate W may be held on the electrostatic chuck 30 in an adsorptive manner when a direct current (DC) power (e.g., a DC voltage) is applied thereto from a DC power generator 70.

The lower electrode 40 included in the substrate stage may have a circular plate-shape, and the lower electrode 40 may be disposed under the electrostatic chuck 30. The lower electrode 40 may be supported by a driving portion 34 such that the lower electrode 40 may move vertically, e.g. upward and downward. For example, the lower electrode 40 and/or the substrate stage may be moved up and down by the driving arm/driving portion 34. The lower electrode 40 may be referred to as a substrate electrode.

The substrate W may be mounted on an upper surface of the electrostatic chuck 30, and a focus ring (not illustrated) may be installed on the substrate stage to surround the substrate W. The lower electrode 40 may have a diameter greater than a diameter of the substrate W. The lower electrode 40 may have a cooling channel (not illustrated) therein. To increase a control accuracy of a substrate temperature, a heat transfer gas such as a He gas and/or another inert gas may be supplied to a gap between the electrostatic chuck 30 and the substrate W.

A door or gate (not illustrated) for loading and/or unloading the substrate W may be provided in a sidewall of the chamber 20. The substrate W may be loaded/unloaded onto/from the substrate stage through the gate.

A gas exhaust port 24 may be provided in a bottom portion of the chamber 20. The gas exhaust pipe/gas exhaust unit 26 may be connected to the gas exhaust port 24 through a gas exhaust line. The gas exhaust unit 26 may include a vacuum pump such as a turbo-molecular pump and/or the like, to control a pressure of the chamber 20 such that the processing space in the chamber 20 may be depressurized to a desired (or proper or predetermined) vacuum level. Additionally or alternatively, process by-products and/or residual process gases may be discharged through the gas exhaust port 24.

The chamber 20 may include a top or cover 22 covering an upper portion of the chamber 20. The cover 22 may seal the upper portion of the chamber 20 airtight. The upper electrode 50 may be disposed outside the chamber 20 such that the upper electrode 50 faces or opposes the lower electrode 40. The upper electrode 50 may be disposed on the cover 22. The upper electrode 50 may include or be, for example, a radio frequency (RF) antenna. For example, the RF antenna may have a coil shape when viewed in a plan view. For example, the RF antenna may have a spiral shape emanating from a center of an upper surface of the cover 22 and moving farther away as it revolves around the center of the upper surface of the cover 22. The cover 22 may include a circular plate dielectric window. The dielectric window may include a dielectric material. For example, the dielectric window may include alumina ($Al_2O_3$). An electromagnetic signal generated from the sinusoidal power generator 51 may be transferred from the antenna into the chamber 20 through the dielectric window.

For example, the upper electrode 50 may include an inner coil 50a and an outer coil 50b. Either or both of the inner coil 50a and the outer coil 50b may have a spiral shape and/or a concentric shape. The inner coil 50a and the outer coil 50b may generate inductively coupled plasma in a plasma space P of the chamber 20. Although two coils 50a and 50b are described exemplarily, it may be understood that the number, arrangement, etc. of the coils may not be limited thereto, and there may be one coil, or more than two coils.

In some example embodiments, the gas supply unit may include gas supply lines 60a and 60b, a flow controller 62 (e.g. a mass flow controller) and a gas source 64, such as a gas reservoir. For example, the gas supply unit may refer to a set of gas supplying elements. The gas supply lines 60a and 60b may be connected to the upper portion and/or a side portion of the chamber 20 to supply gases into the chamber 20 therethrough. For example, the gas supply lines may include a vertical gas supply line 60a which is connected to the chamber 20 through the cover 22 and a horizontal gas supply line 60b connected to the chamber 20 through the sidewall of the chamber 20. Various gases such as reactive gases and/or inert gases may be supplied into the plasma space P of the chamber 20 through the vertical gas supply line 60a and the horizontal gas supply line 60b.

The gas supply unit may supply different gases having a desired/predetermined mixture ratio. The gas source 64 may store the gases, and the gases may be supplied through a plurality of gas lines connected to the gas supply lines 60a and 60b respectively. The flow controller 62 may control the amount of the gases supplied into the chamber 20 through the gas supply lines 60a and 60b. The flow controller 62 may control independently and/or commonly the amount of the gases supplied to the vertical gas supply line 60a and the horizontal gas supply line 60b respectively. For example, the gas source 64 may include a plurality of gas tanks, and the flow controller 62 may include a plurality of mass flow controllers (MFCs) corresponding to the gas tanks, e.g., respectively connected to the gas tanks; however, example embodiments are not limited thereto. The mass flow controllers may control independently the amount of the gases respectively.

The gas supply unit may supply different process gases into the chamber 20. For example, the process gases may include inert gases such as He and/or $N_2$.

The sinusoidal power generator 51 may apply a plasma power (e.g., a plasma voltage) to the upper electrode 50. The plasma power may have a sinusoidal voltage waveform, e.g. may have a frequency spectrum having a specific, single frequency. The sinusoidal power generator 51 may apply the plasma power to the upper electrode 50 to form the plasma within the chamber 20. The sinusoidal power generator 51 may be referred to as a first power generator and/or a plasma power supply, and the plasma power may be referred to as a plasma source power. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The power generator 41 with partial sinusoidal waveform may apply a bias power (e.g., a bias voltage) to the lower electrode 40. The bias power may have a non-sinusoidal voltage waveform during an entire time interval and a sinusoidal voltage waveform during a partial time interval, e.g. may have a frequency spectrum having a plurality of frequencies. The power generator 41 with partial sinusoidal waveform may be referred to as a second power generator, a partial sinusoidal power generator or a bias power supply, and the bias power may be referred to as a bias source power.

The controller 80 may be connected to the sinusoidal power generator 51 and the power generator 41 with partial sinusoidal waveform, and may control operations thereof. The controller 80 may be or may include a microcomputer and various interface circuits, and may control an operation of the plasma processing apparatus 10 based on programs and recipe information stored in and/or downloaded from an external or internal memory.

For example, the controller 80 may be or may include a computer (or several interconnected computers) command include, for example, one or more processors configured by software, such as a central processing unit (CPU), controller, etc., forming various functional modules of the computer. The computer may be or may include a general purpose computer or may be dedicated hardware or firmware (e.g., an electronic or optical circuit, such as application-specific hardware, such as, for example, a digital signal processor (DSP) or a field-programmable gate array (FPGA)). A computer may be configured from several interconnected computers. Each functional module (or unit) described herein may comprise a separate computer, or some or all of the functional module (or unit) may be comprised of and share the hardware of the same computer. Connections and interactions between the units described herein may be hardwired and/or in the form of data (e.g., as data stored in and retrieved from memory of the computer, such as a register, buffer, cache, storage drive, etc., such as part of an application programming interface (API)). As is understood, "software" refers to prescribed rules to operate a computer, such as code or script.

For example, the sinusoidal power generator 51 may include an RF power source 54 and an RF matcher 52 as plasma source elements. The RF power source 54 may generate an RF signal. The RF matcher 52 may match an impedance of the RF signal generated from the RF power source 54 using the coils 50a and 50b to control generation of the plasma.

The sinusoidal power generator 51 may apply a RF power signal (e.g., the plasma power) to the upper electrode 50 based on a plasma power control signal provided from the controller 80. For example, the RF power signal may be generated to have a frequency range of about 13 MHz to about 2.45 GHz, and may be generated to have an RF power range of about 100 W to about 1000 W.

As the RF power signal having a specific (or, predetermined) frequency (e.g., 13.56 MHz) is applied to the upper electrode 50, an electromagnetic field induced by the upper electrode 50 may be applied to a source gas supplied within the chamber 20 to generate the plasma.

The power generator 41 with partial sinusoidal waveform may apply a bias power signal (e.g., the bias power) to the lower electrode 40 based on a bias power control signal provided from the controller 80. The power generator 41 with partial sinusoidal waveform may apply the bias power signal having a desired frequency and a desired voltage waveform (e.g., a non-sinusoidal voltage waveform during an entire time interval and a sinusoidal voltage waveform during a partial time interval) to the lower electrode 40.

The frequency and the voltage waveform of the bias power signal applied by the power generator 41 with partial sinusoidal waveform may be controlled such that a desired/predetermined voltage and a desired/predetermined ion energy distribution may be generated on or near a surface of a substrate W and a desired/predetermined ion flux and a desired/predetermined etching rate may be obtained. Detailed configurations and operations of the power generator 41 with partial sinusoidal waveforms will be described later.

In some example embodiments, the plasma processing apparatus 10 may include a temperature control device, e.g. within the substrate stage. The temperature control device may include a heater and/or a cooler. For example, the temperature control device may include a heater 32 within the electrostatic chuck 30 to control a temperature of the electrostatic chuck 30, a heater power supply 70 configured to supply a power to the heater 32, and a filter 72 disposed between the heater 32 and the heater power supply 70.

In some example embodiments, the plasma processing apparatus 10 may further include a sinusoidal power generator for applying a bias power having a sinusoidal waveform to the lower electrode 40, and a switching circuit for simultaneously or selectively applying the bias power having the sinusoidal waveform and the bias power having the non-sinusoidal waveform.

Figure 3:
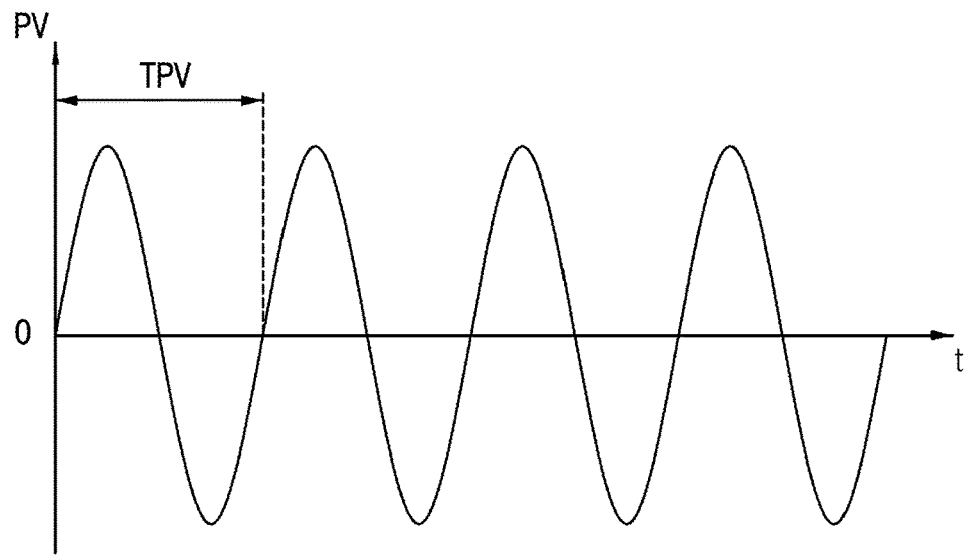
FIG. 3 is a waveform diagram illustrating a plasma power generated from a sinusoidal power generator of a plasma processing apparatus according to example embodiments.

FIG. 3 is a waveform diagram illustrating a plasma power generated from a sinusoidal power generator of a plasma processing apparatus according to example embodiments.

Referring to FIG. 3, a plasma power (or plasma voltage) PV may have a sinusoidal voltage waveform. For example, the plasma power PV may have a voltage waveform of a sinusoidal wave that repeats every specific/predetermined period TPV, and may have a frequency corresponding to the period TPV. For example, the plasma power PV may have or operate with a fixed frequency or significantly fixed frequency.

Figure 4:
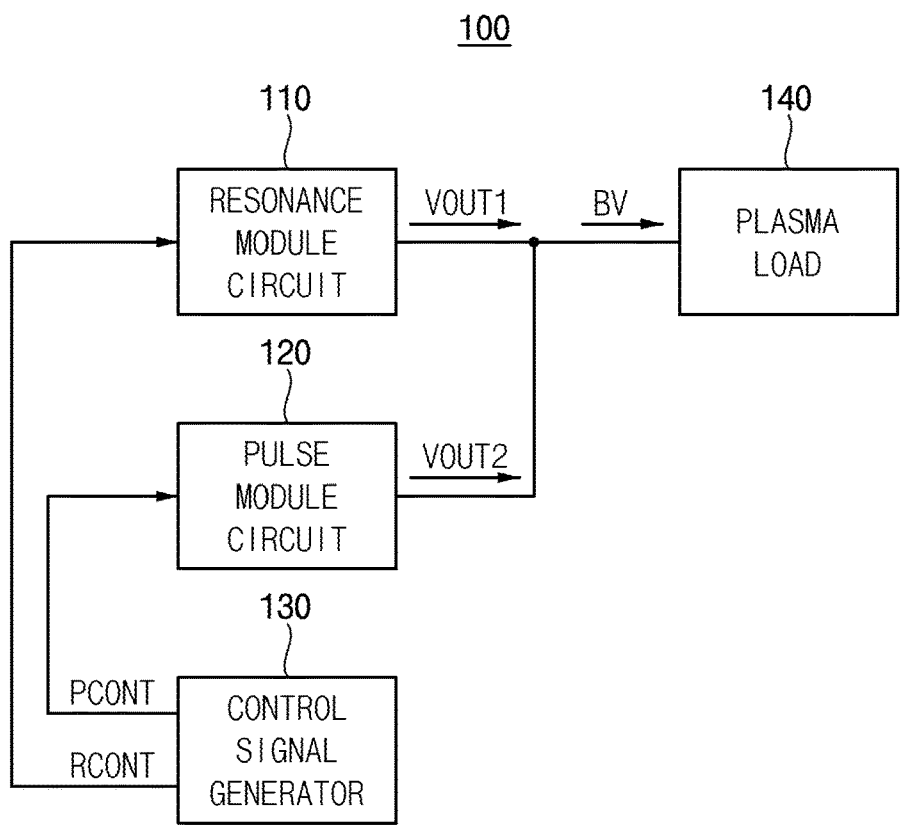
FIG. 4 is a block diagram illustrating a power generator with partial sinusoidal waveform according to example embodiments.

FIG. 4 is a block diagram illustrating a power generator with partial sinusoidal waveform according to example embodiments.

Referring to FIG. 4, a power generator 100 with partial sinusoidal waveform includes a resonance module circuit 110 and a pulse module circuit 120. The power generator 100 with partial sinusoidal waveform may further include a control signal generator 130 and/or a plasma load 140.

The resonance module circuit 110 generates a first output voltage VOUT1 based on a plurality of resonance control signals RCONT. For example, the resonance module circuit 110 includes a plurality of resonance control switches, and generates the first output voltage VOUT1 by selectively turning on and off the plurality of resonance control switches based on the plurality of resonance control signals RCONT. A voltage level of the first output voltage VOUT1 may vary or may be changed based on the plurality of resonance control signals RCONT. For example, as will be described with reference to FIG. 6, the resonance module circuit 110 may include an inductor and a capacitor, and the first output voltage VOUT1 may be generated using a resonance by the inductor and the capacitor. Alternatively or additionally, the resonance module circuit 110 may generate a first output current corresponding to the first output voltage VOUT1, or may generate both the first output voltage VOUT1 and the first output current. For example, the resonance module circuit 110 may generate at least one of the first output voltage VOUT1 and the first output current.

The pulse module circuit 120 generates a second output voltage VOUT2 based on a plurality of pulse control signals PCONT. For example, the pulse module circuit 120 includes a plurality of pulse control switches, and generates the second output voltage VOUT2 by selectively turning on and off the plurality of pulse control switches based on the plurality of pulse control signals PCONT. A voltage level of the second output voltage VOUT2 may vary or may be changed based on the plurality of pulse control signals PCONT. Alternatively or additionally, the pulse module circuit 120 may generate a second output current corresponding to the second output voltage VOUT2, or may generate both the second output voltage VOUT2 and the second output current. For example, the pulse module circuit 120 may generate at least one of the second output voltage VOUT2 and the second output current.

In some example embodiments, each of the plurality of resonance control switches included in the resonance module circuit 110 and the plurality of pulse control switches included in the pulse module circuit 120 may include a transistor, and the transistor may be used only in a switching mode or an on/off mode, not in a linear mode. Accordingly, the generation of heat may be reduced or minimized even when a high voltage is applied to the transistor.

Detailed configurations and operations of the resonance module circuit 110 and the pulse module circuit 120 will be described with reference to FIGS. 6, 7A, 7B and 7C.

The plasma load 140 may be connected to outputs of the resonance module circuit 110 and the pulse module circuit 120, and may generate a bias power (or bias voltage) BV corresponding to a sum of the first and second output voltages VOUT1 and VOUT2. For example, the plasma load 140 may be modeled as a circuit including at least one resistor, and may generate a voltage (e.g., the bias power BV) by applying a current.

As described above, at least one of the first output voltage VOUT1 and the first output current may be generated and at least one of the second output voltage VOUT2 and the second output current may be generated based on the plurality of resonance control signals RCONT and the plurality of pulse control signals PCONT. In addition, the bias power BV, which has a non-sinusoidal voltage waveform during an entire time interval (e.g., an overall non-sinusoidal voltage waveform) and a sinusoidal voltage waveform during a partial time interval (e.g., a partial sinusoidal voltage waveform), may be generated based on at least one of the first output voltage VOUT1 and the first output current, and at least one of the second output voltage VOUT2 and the second output current.

The control signal generator 130 may generate the plurality of resonance control signals RCONT and the plurality of pulse control signals PCONT. In some example embodiments, the control signal generator 130 may be disposed outside the power generator 100 with partial sinusoidal waveform (e.g., may be disposed in the controller 80 of FIG. 1). Although not illustrated in FIG. 4, the control signal generator 130 may further generate voltage source control signals for controlling voltage sources included in the resonance module circuit 110, may further generate an inductor control signal for controlling an inductance of the inductor included in the resonance module circuit 110, and/or may further generate a capacitor control signal for controlling a capacitance of the capacitor included in the resonance module circuit 110.

Figure 5:
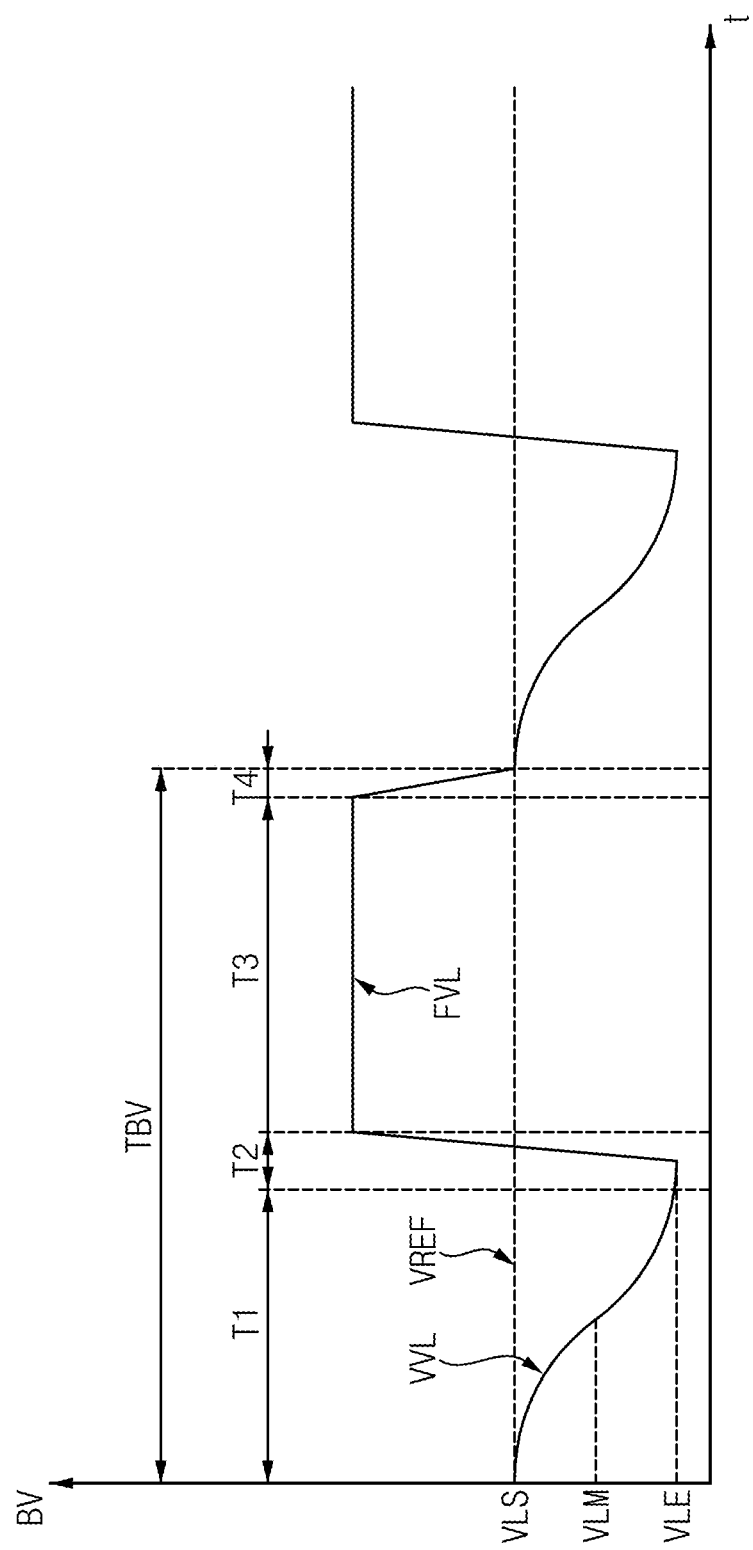
FIG. 5 is a waveform diagram illustrating a bias power generated from a power generator with partial sinusoidal waveform according to example embodiments.

FIG. 5 is a waveform diagram illustrating a bias power generated from a power generator with partial sinusoidal waveform according to example embodiments.

Referring to FIG. 5, the bias power (or bias voltage) BV may have a non-sinusoidal voltage waveform during an entire time interval (e.g., an overall non-sinusoidal voltage waveform) and a sinusoidal voltage waveform during a partial time interval of the entire time interval (e.g., a partial sinusoidal voltage waveform within the overall non-sinusoidal voltage waveform). For example, the bias power BV may have a voltage waveform of a non-sinusoidal wave that repeats every specific or predetermined period TBV. For example, the bias power BV may have a frequency corresponding to the period TBV.

The period TBV of the bias power BV may include a ramp interval T1, a first transition interval T2, a pulse interval T3, and a second transition interval T4. The ramp interval T1 may represent a time interval in which the bias power BV has a variable voltage level VVL that is equal to or lower than (or less than) a reference voltage level VREF and decreases according to the sinusoidal voltage waveform. The ramp interval T1 may be referred to as a ramp down interval or a voltage decreasing interval. The pulse interval T3 may represent a time interval in which the bias power BV has a fixed voltage level FVL that is higher than (or greater than) the reference voltage level VREF. The pulse interval T3 may be referred to as a voltage holding (or maintaining) interval. The first transition interval T2 may be for changing the ramp interval T1 to the pulse interval T3, may be disposed between or occur between the ramp interval T1 and the pulse interval T3, and may represent a time interval in which the bias power BV is transitioned from a voltage level lower than or equal to the reference voltage level VREF to a voltage level higher than the reference voltage level VREF. The second transition interval T4 may be for changing the pulse interval T3 to the ramp interval T1, may be disposed between or occur between the pulse interval T3 and the ramp interval T1, and may represent a time interval in which the bias power BV is transitioned from a voltage level higher than the reference voltage level VREF to a voltage level lower than or equal to the reference voltage level VREF.

Unlike a normal ramp signals or a normal ramp interval in which a voltage level decreases linearly (e.g., a voltage level decreases with a constant slope), the voltage level of the bias power BV generated by the power generator 100 with partial sinusoidal waveform according to example embodiments may decrease nonlinearly during the ramp interval T1. For example, during the ramp interval T1, the bias power BV may have the variable voltage level VVL that decreases according to the sinusoidal voltage waveform (e.g., so that the ramp interval T1 includes a portion of a period of a sinusoidal waveform).

In some example embodiments, the variable voltage level VVL may include a starting voltage level VLS equal to the reference voltage level VREF, a middle voltage level VLM lower than the starting voltage level VLS, and an ending voltage level VLE lower than the middle voltage level VLM.

In some example embodiments, the frequency of the bias power BV may be changeable or variable. For example, the frequency of the bias power BV may be changed or may vary by adjusting at least one of a length of the ramp interval T1, a length of the first transition interval T2, a length of the pulse interval T3, and a length of the second transition interval T4. For example, the frequency of the bias power BV may be changed under a control of the control signal generator 130. For example, the frequency of the bias power BV may be changed within a range of about 100 kHz to about 800 kHz. However, example embodiments are not limited thereto, and the frequency of the bias power BV may be changed within a range of about 1 kHz to about 10 MHz. An operation of changing the frequency of the bias power BV will be described with reference to an example configuration of the power generator 100 with partial sinusoidal waveform.

In some example embodiments, when the frequency of the bias power BV is changed (e.g., increases), the amount of heat generated in the power generator 100 with partial sinusoidal waveform may increase. Therefore, although not illustrated in detail, the power generator 100 with partial sinusoidal waveform may further include a cooling system or cooling means for controlling heat generation.

In some example embodiments, the lengths of the first transition interval T2 and the second transition interval T4 may be very short compared to the lengths of the ramp interval T1 and the pulse interval T3, e.g. may be one or more orders of magnitude shorter compared to the lengths of the ramp interval T1 and the pulse interval T3. Therefore, for convenience of illustration, the first transition interval T2 and the second transition interval T4 may be omitted in subsequent figures such as FIG. 9A.

Figure 6:
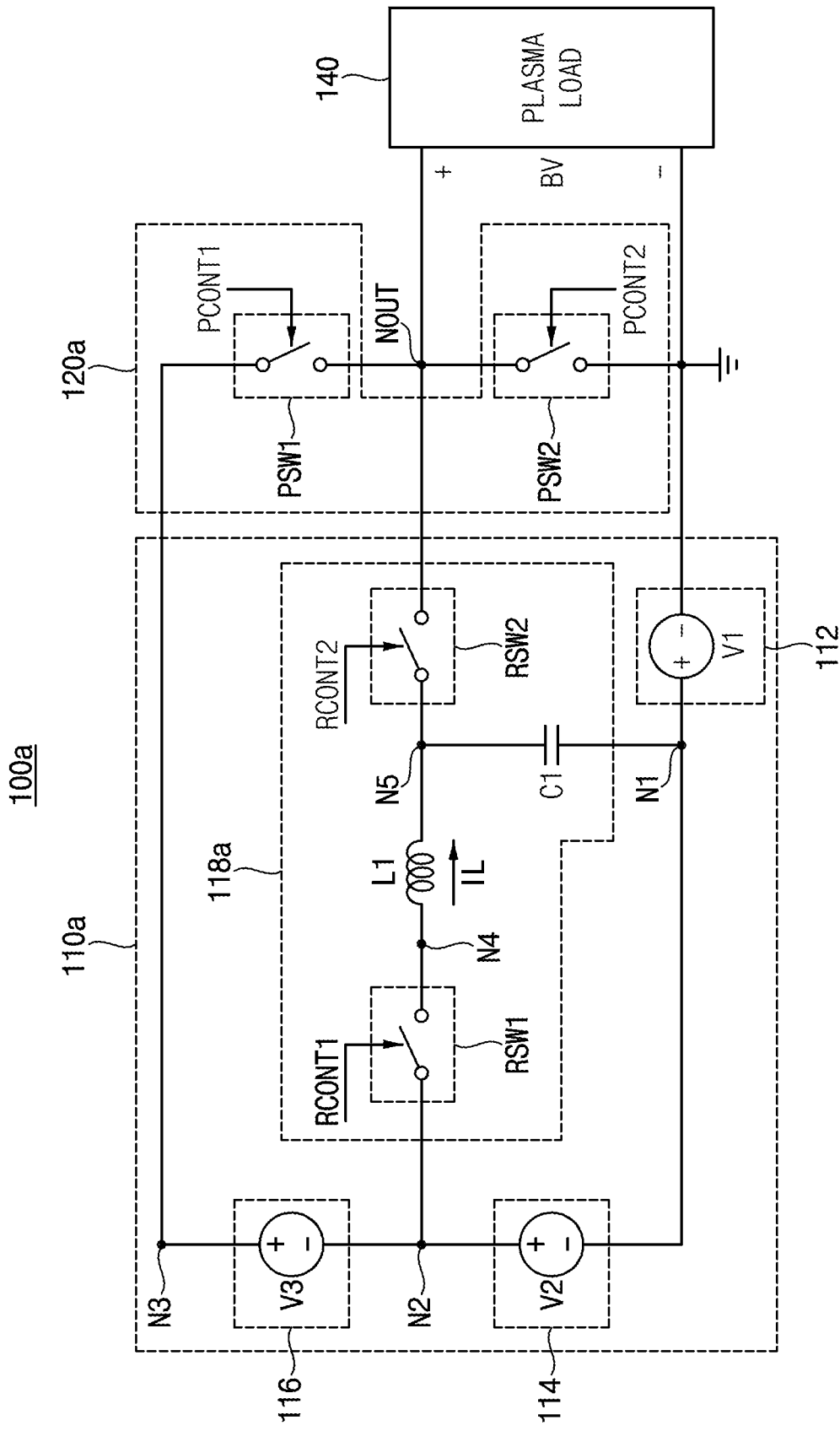
FIG. 6 is a circuit diagram illustrating an example of a power generator with partial sinusoidal waveform of FIG. 4.

FIG. 6 is a circuit diagram illustrating an example of a power generator with partial sinusoidal waveform of FIG. 4. The descriptions repeated with FIG. 4 will be omitted for brevity.

Referring to FIG. 6, a power generator 100a with partial sinusoidal waveform includes a resonance module circuit 110a and a pulse module circuit 120a. The power generator 100a with partial sinusoidal waveform may further include a plasma load 140. For convenience of illustration, the control signal generator 130 is omitted in FIG. 6.

The resonance module circuit 110a and the pulse module circuit 120a may generate a bias power BV provided to the plasma load 140.

The resonance module circuit 110a may include a first voltage source 112, a second voltage source 114, a third voltage source 116, and an energy recovery circuit 118a.

The first voltage source 112 may be connected between a first node N1 and a ground voltage, and may provide a voltage having a first voltage level V1. The second voltage source 114 may be connected between the first node N1 and a second node N2, and may provide a voltage having a second voltage level V2. The third voltage source 116 may be connected between the second node N2 and a third node N3, and may provide a voltage having a third voltage level V3.

The starting voltage level VLS of the variable voltage level VVL in FIG. 5 may be determined by the first voltage source 112. The middle voltage level VLM of the variable voltage level VVL in FIG. 5 may be determined by the second voltage source 114. The ending voltage level VLE of the variable voltage level VVL in FIG. 5 may be determined by the third voltage source 116.

The energy recovery circuit 118a may be connected to the first node N1, the second node N2, and an output node NOUT outputting the bias power BV. The energy recovery circuit 118a may include a first resonance control switch RSW1, an inductor L1, a capacitor C1, and a second resonance control switch RSW2.

The first resonance control switch RSW1 may be connected between the second node N2 and a fourth node N4, and may be turned on and off based on a first resonance control signal RCONT1. The inductor L1 may be connected between the fourth node N4 and a fifth node N5. The capacitor C1 may be connected between the fifth node N5 and the first node N1. The second resonance control switch RSW2 may be connected between the fifth node N5 and the output node NOUT, and may be turned on and off based on a second resonance control signal RCONT2. The first and second resonance control signals RCONT1 and RCONT2 may be included in the plurality of resonance control signals RCONT in FIG. 4.

The ramping (e.g., voltage decreasing) of the bias power BV may be implemented using the inductor L1 and the capacitor C1 included in the energy recovery circuit 118a. For example, the change in the voltage level of the bias power BV (e.g., the variable voltage level VVL that decreases according to the sinusoidal voltage waveform) during the ramp interval T1 in FIG. 5 may be implemented using the swing of the voltage generated from the resonance by the inductor L1 and capacitor C1. For example, the energy charged in the capacitor C1 may be recovered according to the timing control of the first resonance control switch RSW1.

The pulse module circuit 120a may include a first pulse control switch PSW1 and a second pulse control switch PSW2.

The first pulse control switch PSW1 may be connected between the third node N3 and the output node NOUT, and may be turned on and off based on a first pulse control signal PCONT1. The second pulse control switch PSW2 may be connected between the output node NOUT and the first voltage source 112 (e.g., between the output node NOUT and the ground voltage), and may be turned on and off based on a second pulse control signal PCONT2. The first and second pulse control signals PCONT1 and PCONT2 may be included in the plurality of pulse control signals PCONT in FIG. 4.

In some example embodiments, each of the resonance control switches RSW1 and RSW2 and the pulse control switches PSW1 and PSW2 may include a transistor. For example, the transistor may be or may include any transistor such as a metal oxide semiconductor field effect transistor (MOSFET). For example, each of the control signals RCONT1, RCONT2, PCONT1 and PCONT2 may be applied to a gate electrode of the transistor.

In some example embodiments, the transistors included in the resonance control switches RSW1 and RSW2 and the pulse control switches PSW1 and PSW2 may be used only in a switching mode or on/off mode, not in a linear mode. Accordingly, the amount of heat generated from the transistors may be reduced.

When a transistor is used in a linear mode (e.g., when the transistor is used as a variable resistor), an operation of the transistor may be controlled by adjusting a voltage applied to a gate electrode of the transistor (e.g., by changing a channel width of the transistor). In this case, the power loss in the transistor may be very large, and thus the heat loss, e.g., heat generation may greatly increase. Since a bias power used in a plasma processing apparatus is about several hundreds of volts (or watts) to several tens of kilovolts (or kilowatts), it may be difficult to increase the bias power as desired due to such power loss and heat generation.

In contrast, when the transistor is used in a switching mode or an on/off mode, such as in the power generator 100a with partial sinusoidal waveform according to example embodiments, the power loss in the transistor may be caused only by the drain-source on-resistance (e.g., Rds), and thus the power loss in the transistor may be relatively small and the heat generation may be reduced. Accordingly, the bias power BV may increase as much as desired without excessive heat generation, and the high-output power generator may be efficiently implemented.

Figure 7A:
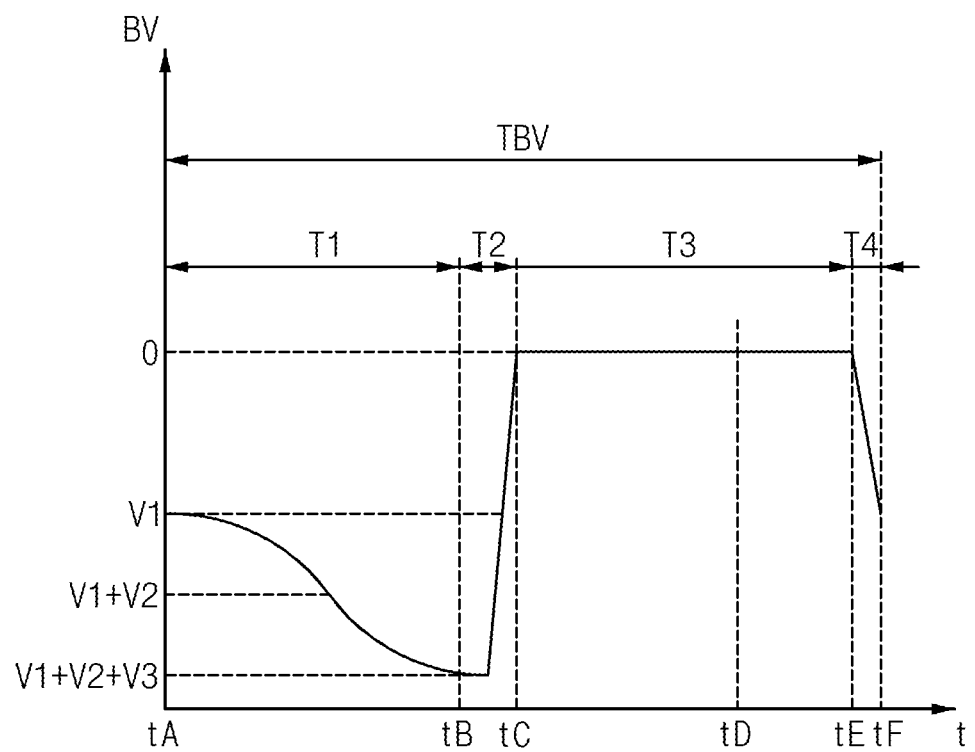
FIGS. 7A, 7B and 7C are diagrams for describing an operation of a power generator with partial sinusoidal waveform of FIG. 6.
Figure 7B:
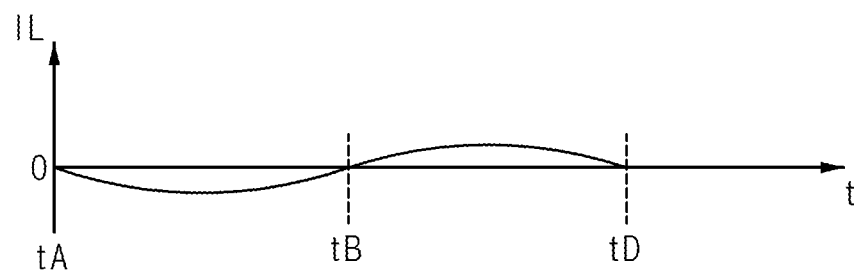
Figure 7C:
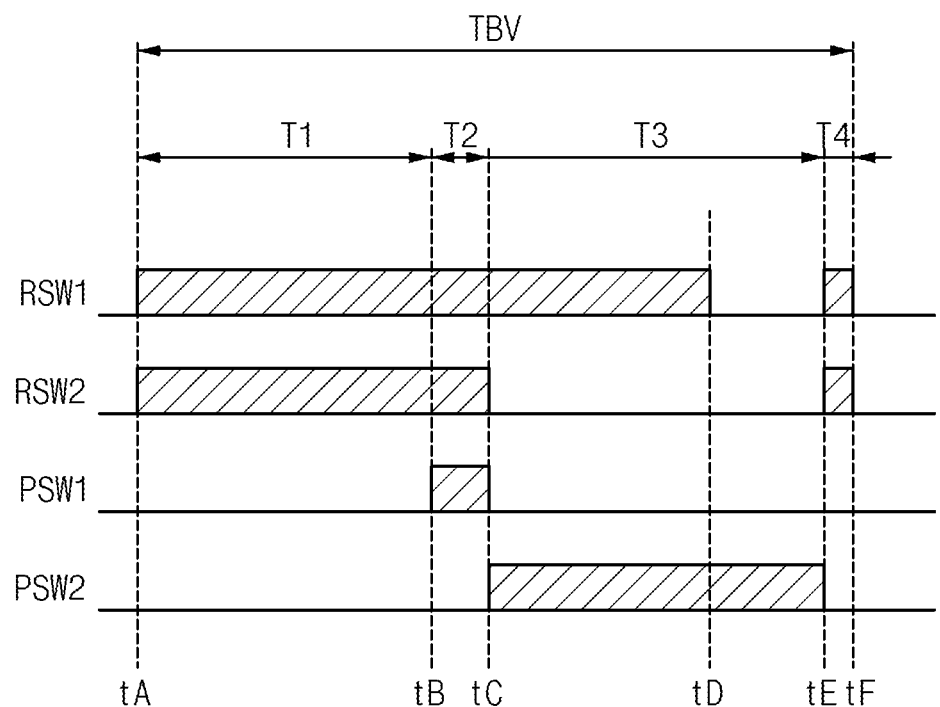

FIGS. 7A, 7B and 7C are diagrams for describing an operation of a power generator with partial sinusoidal waveform of FIG. 6.

FIG. 7A is a graph illustrating the bias power BV generated by the power generator 100a with partial sinusoidal waveform. FIG. 7B is a graph illustrating an inductor current IL flowing through the inductor L1 included in the energy recovery circuit 118a in the power generator 100a with partial sinusoidal waveform according to the generation of the bias power BV. FIG. 7C is a diagram illustrating on/off operations of the resonance control switches RSW1 and RSW2 and the pulse control switches PSW1 and PSW2 included in the power generator 100a with partial sinusoidal waveform according to the generation of the bias power BV.

Referring to FIGS. 6 and 7A, the voltage waveform of the bias power BV may be similar to that described with reference to FIG. 5, and thus the descriptions repeated with FIG. 5 will be omitted for brevity. A time interval between time tA and time tB may be the ramp interval T1, a time interval between time tB and time tC may be the first transition interval T2, a time interval between time tC and time tE may be the pulse interval T3, and a time interval between time tE and time tF may be the second transition interval T4.

During the ramp interval T1, the starting voltage level VLS of the variable voltage level VVL in FIG. 5 may be set or determined to the first voltage level V1 by the first voltage source 112, the middle voltage level VLM of the variable voltage level VVL in FIG. 5 may be set or determined to a sum V1+V2 of the first and second voltage levels V1 and V2 by the first and second voltage sources 112 and 114, and the ending voltage level VLE of the variable voltage level VVL in FIG. 5 may be set or determined to a sum V1+V2+V3 of the first, second and third voltage levels V1, V2 and V3 by the first, second and third voltage sources 112, 114 and 116. For example, the first voltage level V1 may be about −2 kV, the sum V1+V2 of the first and second voltage levels V1 and V2 may be about −3 kV, and the sum V1+V2+V3 of the first, second and third voltage levels V1, V2 and V3 may be about −4 kV, but example embodiments are not limited thereto. For example, the third voltage level V3 may be dependently set in consideration of the voltage loss due to the inductor L1 and an internal resistance of the first resonance control switch RSW1. During the pulse interval T3, the fixed voltage level FVL may be about 0 V, but example embodiments are not limited thereto. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In some example embodiments, the voltage level of the bias power BV may be changed by adjusting at least one of the first voltage source 112, the second voltage source 114, and the third voltage source 116. For example, the voltage level of the bias power BV may be changed under a control of the control signal generator 130 in FIG. 4. Although not illustrated in detail, the control signal generator 130 may generate voltage source control signals for controlling at least one of the voltage sources 112, 114 and 116. At least one of the starting voltage level VLS, the middle voltage level VLM, and the end voltage level VLE of the variable voltage level VVL may be changed and/or the fixed voltage level FVL may be changed by adjusting at least one of the first, second and third voltage levels V1, V2 and V3 based on the voltage source control signals.

Referring to FIGS. 6, 7B and 7C, the resonance control switches RSW1 and RSW2 and the pulse control switches PSW1 and PSW2 included in the resonance module circuit 110a and the pulse module circuit 120a may perform switching operations as illustrated in FIG. 7C to generate the bias power BV illustrated in FIG. 7A.

For example, during the ramp interval T1 between time tA and time tB (e.g., to begin the ramp interval T1), the first and second resonance control switches RSW1 and RSW2 may be turned on, and the first and second pulse control switches PSW1 and PSW2 may be turned off. During the first transition interval T2 between time tB and time tC (e.g., to begin the first transition interval T2), the first and second resonance control switches RSW1 and RSW2 may be maintained at a turn-on state, the first pulse control switch PSW1 may be turned on, and the second pulse control switch PSW2 may be maintained at a turn-off state. During the pulse interval T3 between time tC and time tE (e.g., to begin the pulse interval T3 or within the pulse interval T3), the first and second resonance control switches RSW1 and RSW2 may be turned off, the first pulse control switch PSW1 may be turned off, and the second pulse control switch PSW2 may be turned on. During the second transition interval T4 between time tE and time tF (e.g., to begin the second transition interval T4), the first and second resonance control switches RSW1 and RSW2 may be turned on, the first pulse control switch PSW1 may be maintained at a turn-off state, and the second pulse control switch PSW2 may be turned off. In FIG. 7C, each hatched portion indicates that each switch is turned on, the operation of turning on the switch indicates that the switch is closed, and the operation of turning off the switch indicates that the switch is opened.

In some example embodiments, in the pulse interval T3, turn-off timings of the second resonance control switch RSW2 and the first pulse control switch PSW1 may be different from a turn-off timing of the first resonance control switch RSW1. For example, the second resonance control switch RSW2 and the first pulse control switch PSW1 may be turned off at a starting time point of the pulse interval T3, e.g., at time tC. The first resonance control switch RSW1 may be turned off at a first time point, e.g., at time tD, at which a predetermined time has elapsed from the starting time point (e.g., time tC) of the pulse interval T3.

The inductor current IL flowing through the inductor L1 may be formed as illustrated in FIG. 7B. For example, the inductor current IL may be about zero at time tA, which is a starting time point of the ramp interval T1, may change during the ramp interval T1 as illustrated in FIG. 7B according to the resonance by the inductor L1 and the capacitor C1, and may become about zero at time tB, which is an ending time point of the ramp interval T1. After that, during the first transition interval T2, the inductor current IL increases as the first pulse control switch PSW1 is turned on, and the inductor current IL may not immediately become about zero at time tC, which is the starting time point of the pulse interval T3, but may become about zero at time tD at which the predetermined time has elapsed from time tC. Therefore, to prevent damage to the inductor IL, the first resonance control switch RSW1 may be turned off at time tD at which the inductor current IL becomes about zero. For example, the first time point (e.g., time tD) at which the first resonance control switch RSW1 is turned off may indicate a time point at which the inductor current IL flowing through the inductor L1 becomes about zero.

In some example embodiments, the frequency of the bias power BV may be changed by adjusting at least one of the length of the ramp interval T1, the length of the first transition interval T2, the length of the pulse interval T3, and the length of the second transition interval T4. For example, the frequency of the bias power BV may be changed under the control of the control signal generator 130 in FIG. 4.

In some example embodiments, the length of the ramp interval T1 may be changed by adjusting at least one of the inductance of the inductor L1 and the capacitance of the capacitor C1, and the frequency of the bias power BV may be changed by changing the length of the ramp interval T1. For example, although not illustrated in detail, the control signal generator 130 may generate an inductor control signal for controlling the inductance of the inductor L1 and/or a capacitor control signal for controlling the capacitance of the capacitor C1. The frequency of the bias power BV may be changed (e.g., may increase or decrease) by adjusting at least one of the inductance of the inductor L1 and the capacitance of the capacitor C1 based on the inductor control signal and/or the capacitor control signal. For example, as the inductance of the inductor increases or as the capacitance of the capacitor increases, the product of the inductance and the capacitance may increase and the voltage level of the bias power BV may decrease slowly, and thus, the length of the ramp interval T1 may increase. In these examples, the inductor L1 may be a variable inductor having a variable inductance controlled by an inductor control signal, and the capacitor C1 may be a variable capacitor having a variable capacitance controlled by a capacitor control signal.

In some example embodiments, the length of the pulse interval T3 may be changed by adjusting a turn-on timing of the second pulse control switch RSW2, and the frequency of the bias power BV may be changed by changing the length of the pulse interval T3. For example, the control signal generator 130 may generate the second pulse control signal RCONT2 for controlling the turn-on and/or turn-off of the second pulse control switch RSW2. The frequency of the bias power BV may be changed (e.g., may increase or decrease) by adjusting the turn-on timing of the second pulse control switch RSW2 based on the second pulse control signal RCONT2. For example, as the turn-on timing of the second pulse control switch RSW2 increases, the length of the pulse interval T3 may increase.

The power generator with partial sinusoidal waveform according to example embodiments may be implemented and may generate the bias power BV as illustrated in FIGS. 4, 5, 6, 7A, 7B and 7C. For example, during the ramp interval T1, the voltage level of the bias power BV may decrease according to the sinusoidal voltage waveform without decreasing linearly. Accordingly, the bias power BV may increase as much as desired without excessive heat generation, and the high-output power generator may be efficiently implemented. Alternatively or additionally, a relatively narrow ion energy distribution may be formed, and an etching distribution in a radial direction of a wafer may be controlled. Alternatively or additionally, a matcher such as an impedance matched and passive components (e.g. filters, etc.) for a single frequency may not be required or may not be used, and particularly, the matcher may not be required because a voltage is directly applied to the chamber 20.

Figure 8A:
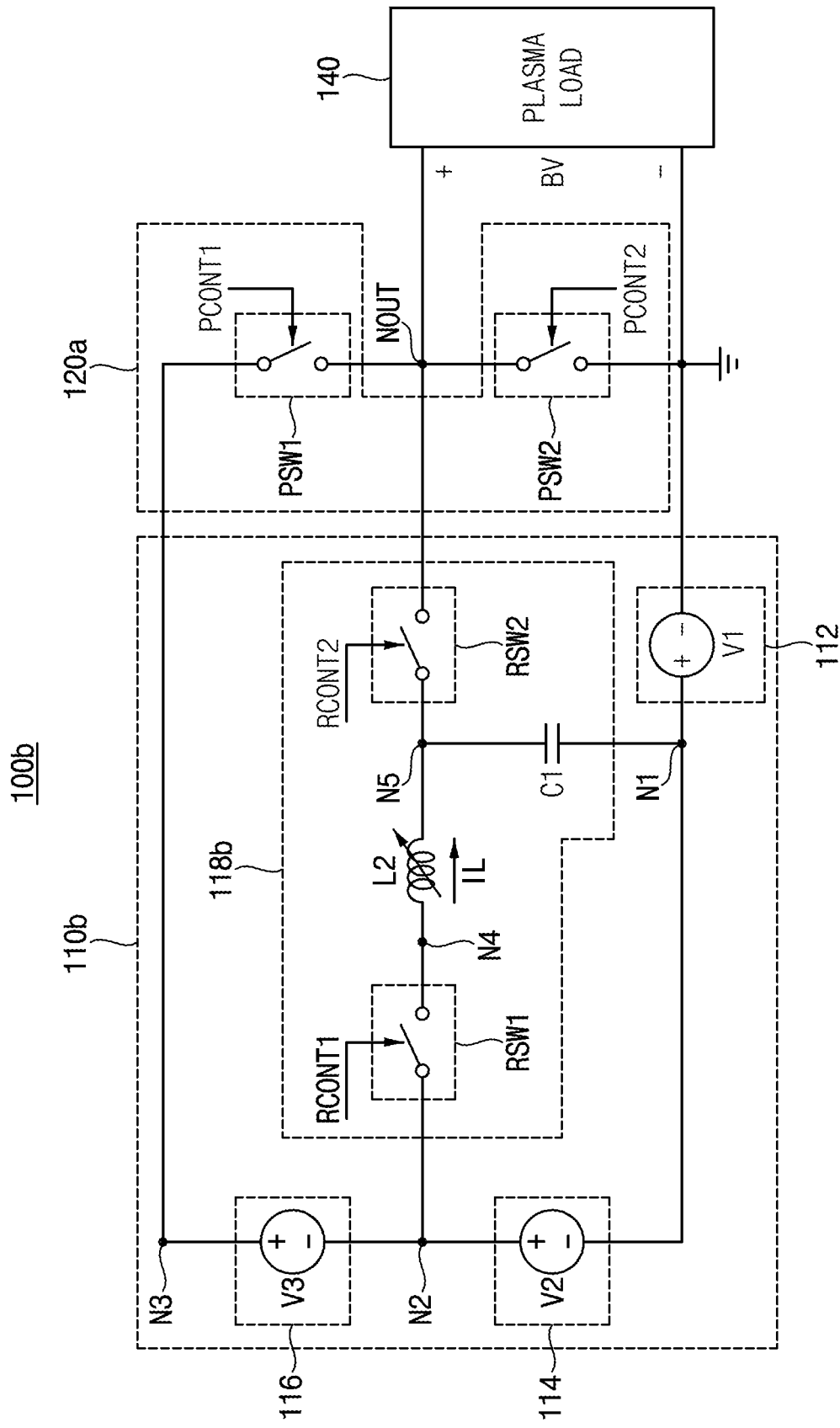
FIGS. 8A and 8B are circuit diagrams illustrating examples of a power generator with partial sinusoidal waveform of FIG. 4.
Figure 8B:
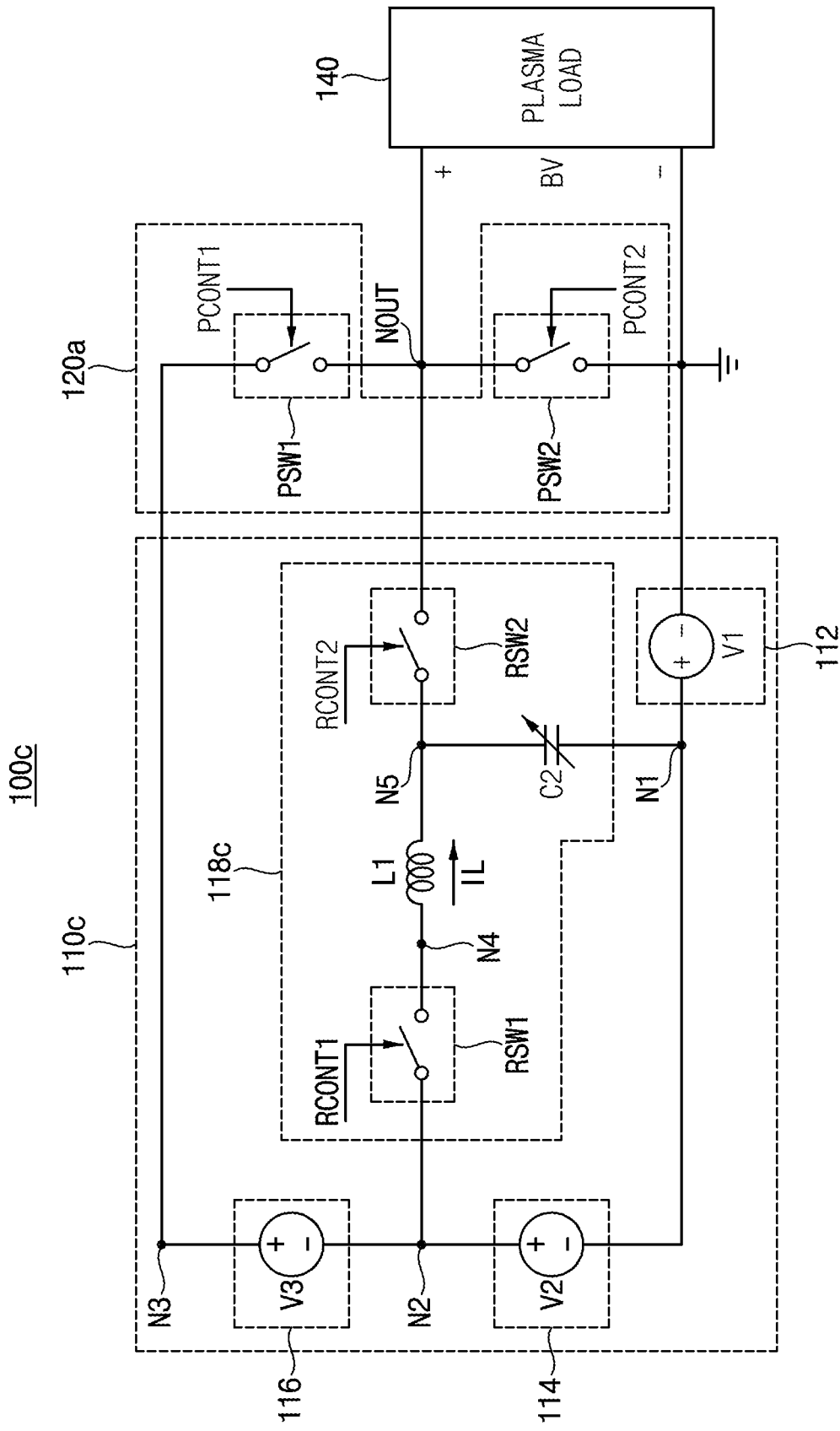

FIGS. 8A and 8B are circuit diagrams illustrating examples of a power generator with partial sinusoidal waveform of FIG. 4. The descriptions repeated with FIG. 6 will be omitted for brevity.

Referring to FIG. 8A, a power generator 100b with partial sinusoidal waveform may include a resonance module circuit 110b, a pulse module circuit 120a and a plasma load 140. The resonance module circuit 110b may include a first voltage source 112, a second voltage source 114, a third voltage source 116, and an energy recovery circuit 118b. The energy recovery circuit 118b may include a first resonance control switch RSW1, a variable inductor L2, a capacitor C1, and a second resonance control switch RSW2.

The power generator 100b with partial sinusoidal waveform of FIG. 8A may be substantially the same as the power generator 100a with partial sinusoidal waveform of FIG. 6, except that a configuration of the resonance module circuit 110b is partially modified.

The energy recovery circuit 118b included in the resonance module circuit 110b may include a variable inductor L2 where an inductance is changeable. In other words, the inductor L1 in FIG. 6 may be replaced with the variable inductor L2 in FIG. 8A. For example, the inductance of the variable inductor L2 may be changed under the control of the control signal generator 130 in FIG. 4, and the frequency of the bias power BV may be changed by changing the inductance of the variable inductor L2, for example, without changing a capacitance of the capacitor C1.

Referring to FIG. 8B, a power generator 100c with partial sinusoidal waveform may include a resonance module circuit 110c, a pulse module circuit 120a and a plasma load 140. The resonance module circuit 110c may include a first voltage source 112, a second voltage source 114, a third voltage source 116, and an energy recovery circuit 118c. The energy recovery circuit 118c may include a first resonance control switch RSW1, an inductor L1, a variable capacitor C2, and a second resonance control switch RSW2.

The power generator 100c with partial sinusoidal waveform of FIG. 8B may be substantially the same as the power generator 100a with partial sinusoidal waveform of FIG. 6, except that a configuration of the resonance module circuit 110c is partially modified.

The energy recovery circuit 118c included in the resonance module circuit 110c may include a variable capacitor C2 where a capacitance is changeable. In other words, the capacitor C1 in FIG. 6 may be replaced with the variable capacitor C2 in FIG. 8B. For example, the capacitance of the variable capacitor C2 can be changed under the control of the control signal generating circuit 130 in FIG. 4, and the frequency of the bias power BV may be changed by changing the capacitance of the variable capacitor C2, for example, without changing the inductance of the inductor L1.

Although example embodiments are described based on specific circuit structures, example embodiments are not limited thereto. For example, the power generator with partial sinusoidal waveform according to example embodiments may be implemented with various circuit structures for generating the bias power BV illustrated in FIG. 5, e.g., the voltage level of the bias power BV may decrease according to the sinusoidal voltage waveform without decreasing linearly, during the ramp interval T1.

FIGS. 9A, 9B, 10A, 10B, 11, 12A, 12B and 12C are diagrams for describing operations of a power generator with partial sinusoidal waveform and a plasma processing apparatus according to example embodiments.

Figure 9A:
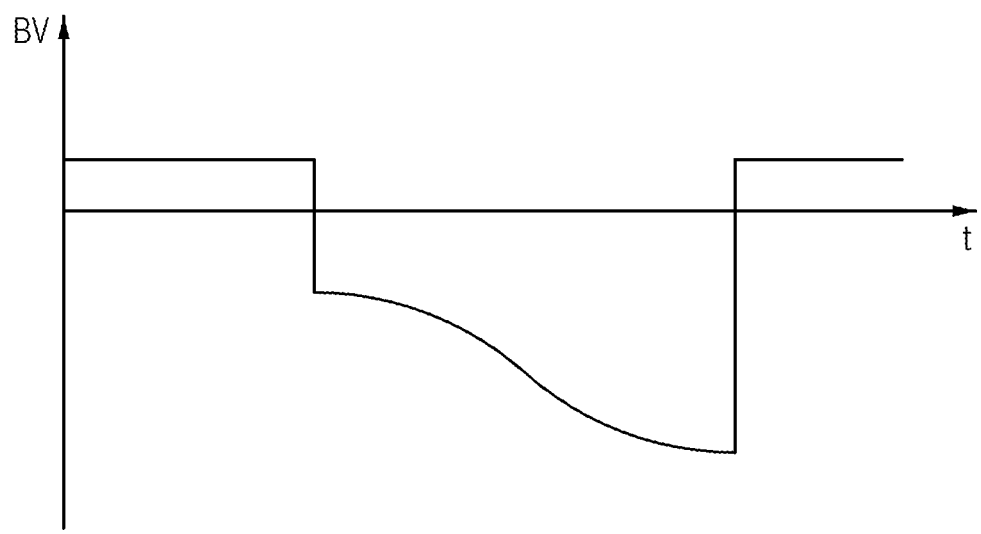
FIGS. 9A, 9B, 10A, 10B, 11, 12A, 12B and 12C are diagrams for describing operations of a power generator with partial sinusoidal waveform and a plasma processing apparatus according to example embodiments.
Figure 9B:
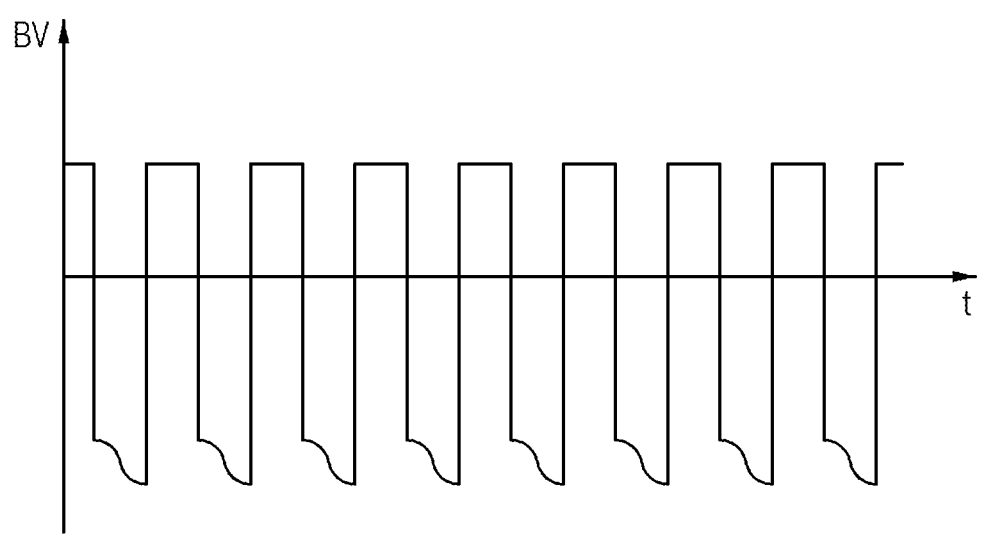

Referring to FIGS. 9A and 9B, a voltage waveform of the bias power BV that is generated by the power generator with partial sinusoidal waveform according to example embodiments and is applied to the lower electrode 40 is illustrated.

FIG. 9A illustrates an example where the bias power BV has a first frequency (e.g. a first fundamental frequency), and FIG. 9B illustrates an example where the bias power BV has a second frequency (e.g. a second fundamental frequency) higher than the first frequency. For example, the first frequency may be about 100 kHz, and the second frequency may be about 800 kHz. For example, as will be described with reference to FIGS. 10A and 10B, the frequency of the bias power BV may be changed for each step in a process of manufacturing a semiconductor device (e.g., in the same process), and the frequency of the bias power BV may be changed in real time during the process.

Figure 10A:
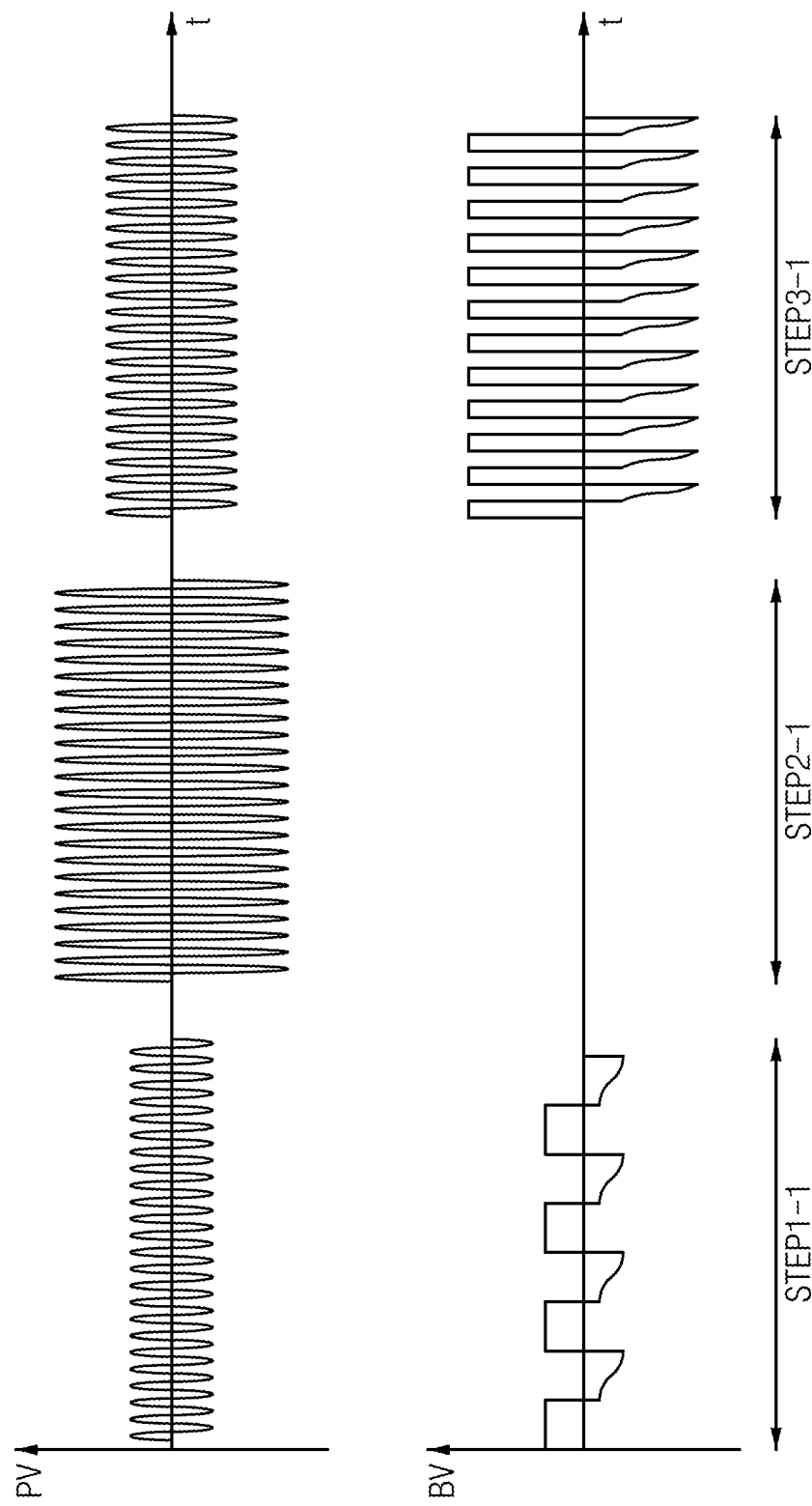
Figure 10B:
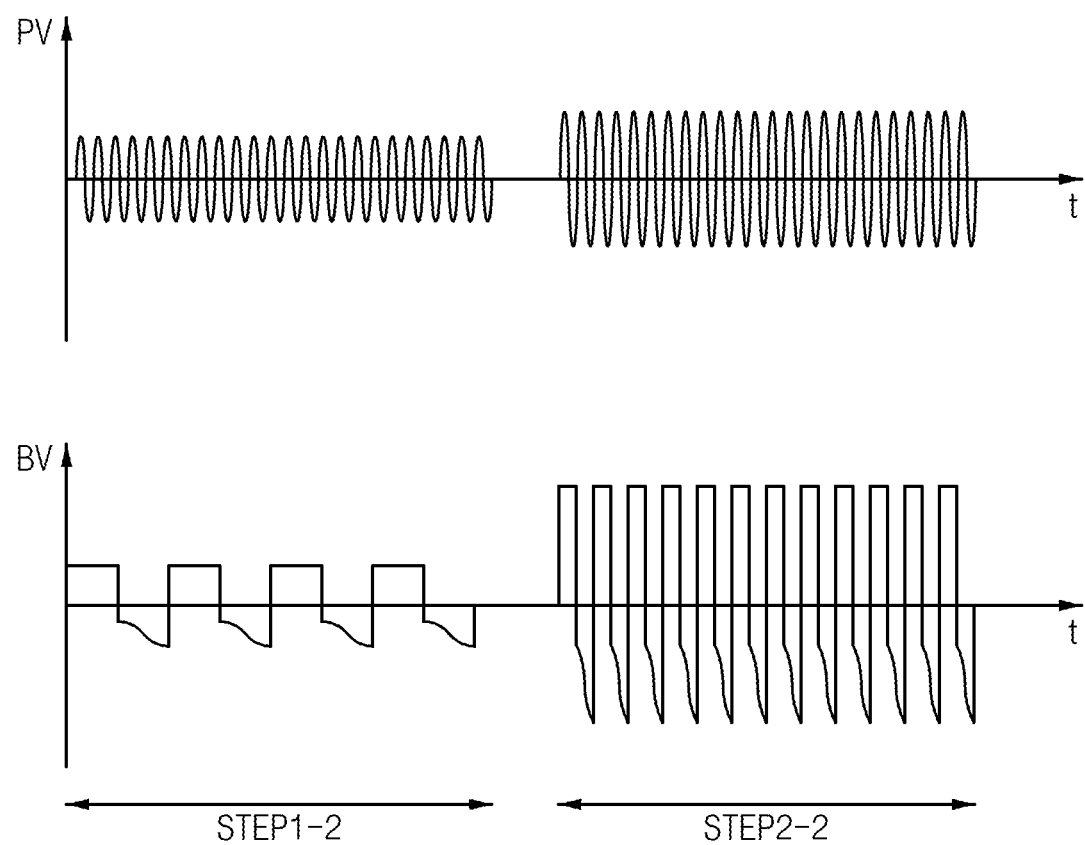

Referring to FIGS. 10A and 10B, the plasma power PV and the bias power BV that are applied to the plasma processing apparatus in the process of manufacturing the semiconductor device are illustrated.

The process of manufacturing the semiconductor device may include various steps based on a plurality of recipes, and one process may include a plurality of steps. FIG. 10A illustrates an example where the process includes three steps STEP1-1, STEP2-1 and STEP3-1, and FIG. 10B illustrates an example where the process includes two steps STEP1-2 and STEP2-2.

In an example of FIG. 10A, the first step STEP1-1 may be or may include a step of removing oxides and/or process by-products, the second step STEP2-1 may be or may include a step of protecting the etching side, and the third step STEP3-1 may be or may include a step of etching to a narrow and deep portion. The first step STEP1-1 may be referred to as a break through step, the second step STEP2-1 may be referred to as an oxidation step, and the third step STEP3-1 may be referred to as a main etching step.

In some example embodiments, during the first step STEP1-1, the bias power BV may be activated to have a first frequency and a first amplitude. During the second step STEP2-1, the bias power BV may be deactivated. During the third step STEP3-1, the bias power BV may be activated to have a second frequency different from the first frequency and a second amplitude different from the first amplitude. For example, the bias power BV having a relatively low frequency and a small amplitude may be used in the first step STEP1-1 to increase the etching for the outer part of the wafer/substrate W, and the bias power BV having a relatively high frequency and a large amplitude may be used in the third step STEP3-1 to improve the etching of the center of the wafer/substrate W. For example, the frequency of the bias power BV may be changed in real time during the process.

The plasma power PV may have different amplitudes during the first step STEP1-1, the second step STEP2-1, and the third step STEP3-1, but the frequency of the plasma power PV may be fixed.

In an example of FIG. 10B, the first step STEP1-2 may be or may include a step of removing oxides or process by-products, and the second step STEP2-2 may be or may include a step of etching to a narrow and deep portion. The first step STEP1-2 and the second step STEP2-2 in FIG. 10B may correspond to the first step STEP1-1 and the third step STEP3-1 in FIG. 10A, respectively.

In some example embodiments, during the first step STEP1-2, the bias power BV may have the first frequency and the first amplitude. During the second step STEP2-2, the bias power BV may have the second frequency and the second amplitude. The plasma power PV may have different amplitudes and the fixed frequency during the first step STEP1-2 and the second step STEP2-2.

In some example embodiments, as described with reference to FIGS. 6 and 7C, the frequency of the bias power BV may be changed by adjusting at least one of the length of the ramp interval T1, the length of the first transition interval T2, the length of the pulse interval T3, and the length of the second transition interval T4. For example, at least one of the lengths of the ramp interval T1, the first transition interval T2, the pulse interval T3, and the second transition interval T4 may be adjusted by changing at least one of the inductance of the inductor L1 and the capacitance of the capacitor C1 or by controlling the turn-on timing of the second pulse control switch RSW2.

In some example embodiments, as described with reference to FIGS. 6 and 7A, the voltage level (e.g., amplitude) of the bias power BV may be changed by adjusting at least one of the first voltage source 112, the second voltage source 114, and the third voltage source 116. For example, the variable voltage level VVL in the ramp interval T1 may be changed from a first variable voltage level to a second variable voltage level, and/or the fixed voltage level FVL in the pulse interval T3 may be changed from a first fixed voltage level to a second fixed voltage level.

Figure 11:
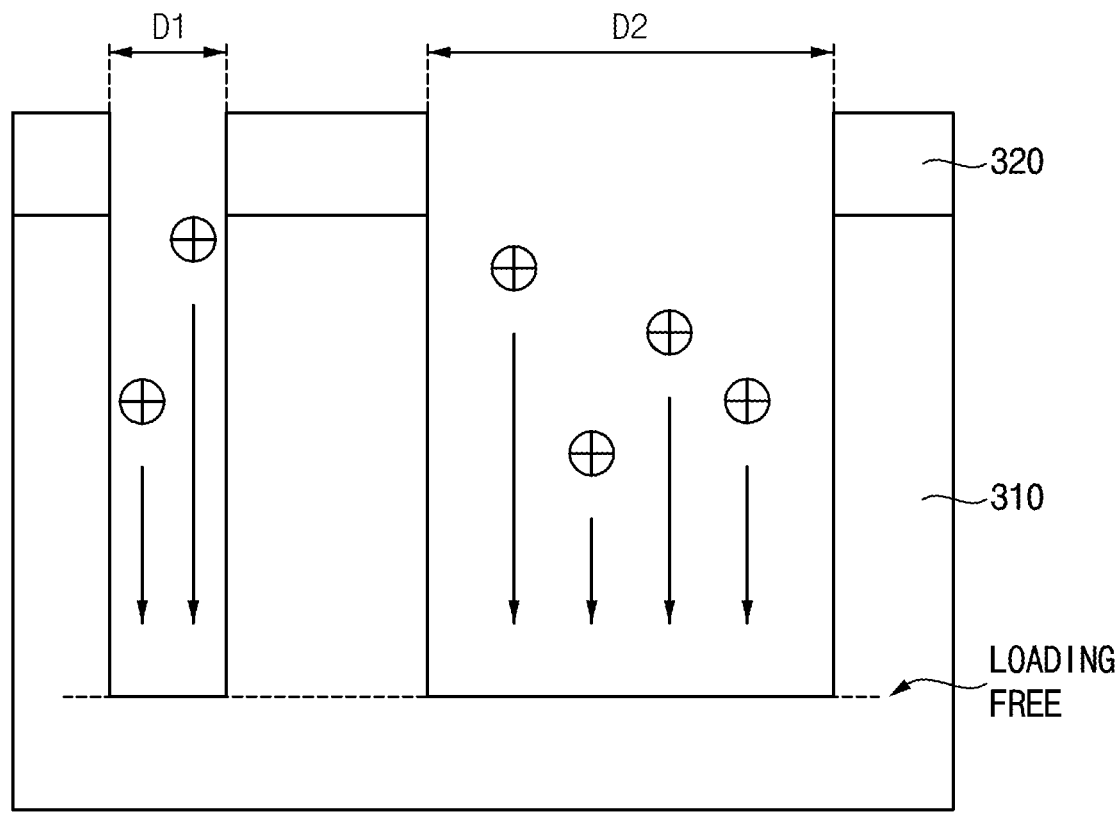

Referring to FIG. 11, an etching process on a semiconductor device using the plasma processing apparatus is illustrated.

The semiconductor device may include a semiconductor layer 310 and a mask layer 320. For example, the semiconductor layer 310 may include or be formed of Si, and the mask layer 320 may include or be formed of a nitride and/or an organic material such as a photoresist and/or $SiO_2$.

In some example embodiments, the mask layer 320 may include a plurality of openings. For example, the plurality of openings may have different diameters/widths/lengths. The etching process may be performed to form a first opening having a first diameter/width D1 and a second opening having a second diameter/width D2.

When the bias power BV, which has a non-sinusoidal voltage waveform during an entire time interval and a sinusoidal voltage waveform during a partial time interval, is used or applied according to example embodiments, the ion energy having a relatively narrow single peak (or monopeak) may be formed. Thus, when the etching process is performed using the bias power BV, the straightness (or directivity or anisotropy) of ions may be improved, an etching profile of the semiconductor device may be improved, and the bowing or loss of anisotropy may be reduced. The ions may reach a narrow and deep region due to the high straightness of ions, and thus a difference between a depth of a widely-etched area and a depth of a narrowly-etched area (e.g., a difference between a depth of the first opening and a depth of the second opening), for example, an intra cell (IC) loading, may be removed. For example, the IC loading may refer to non-uniform patterns formed in a cell region of the semiconductor device caused by or related to different etching rates between different pattern widths, or the IC loading may be a phenomenon that an etching rate depends on pattern widths. Alternatively or additionally, the plasma density in the radial direction of the wafer may be controlled by the frequency change, and thus the etching distribution in the radial direction of the wafer may be controlled.

Figure 12A:
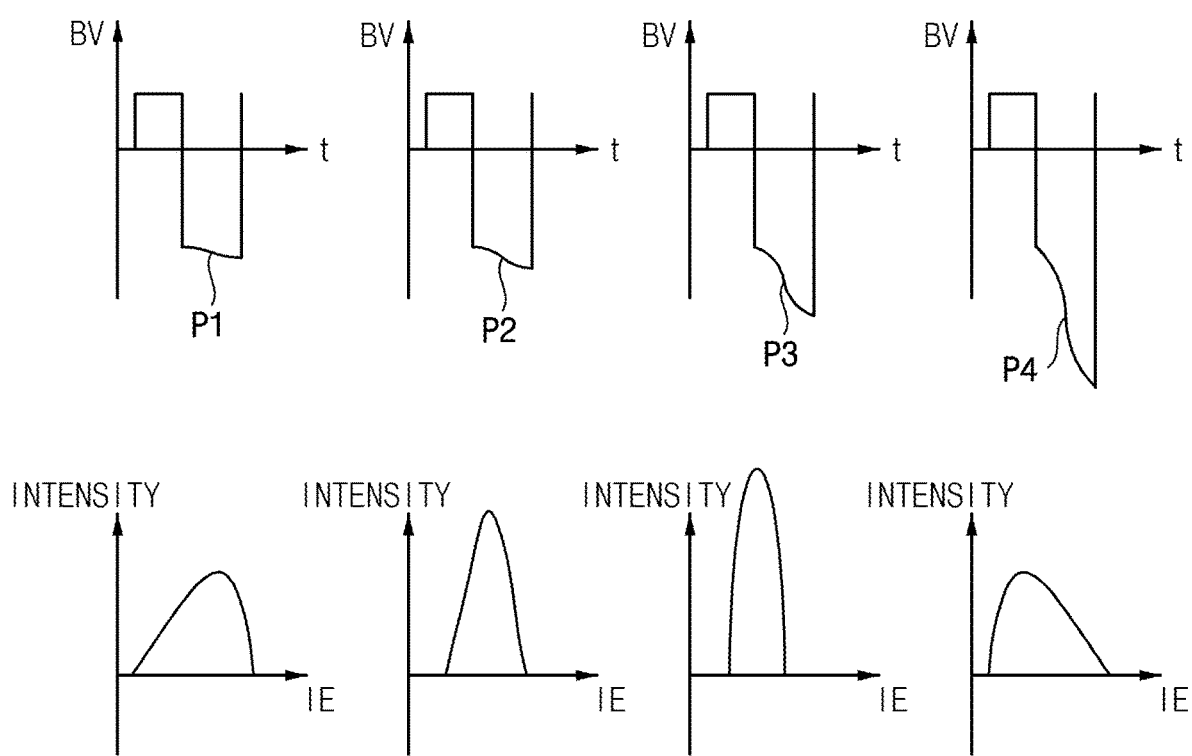
Figure 12B:
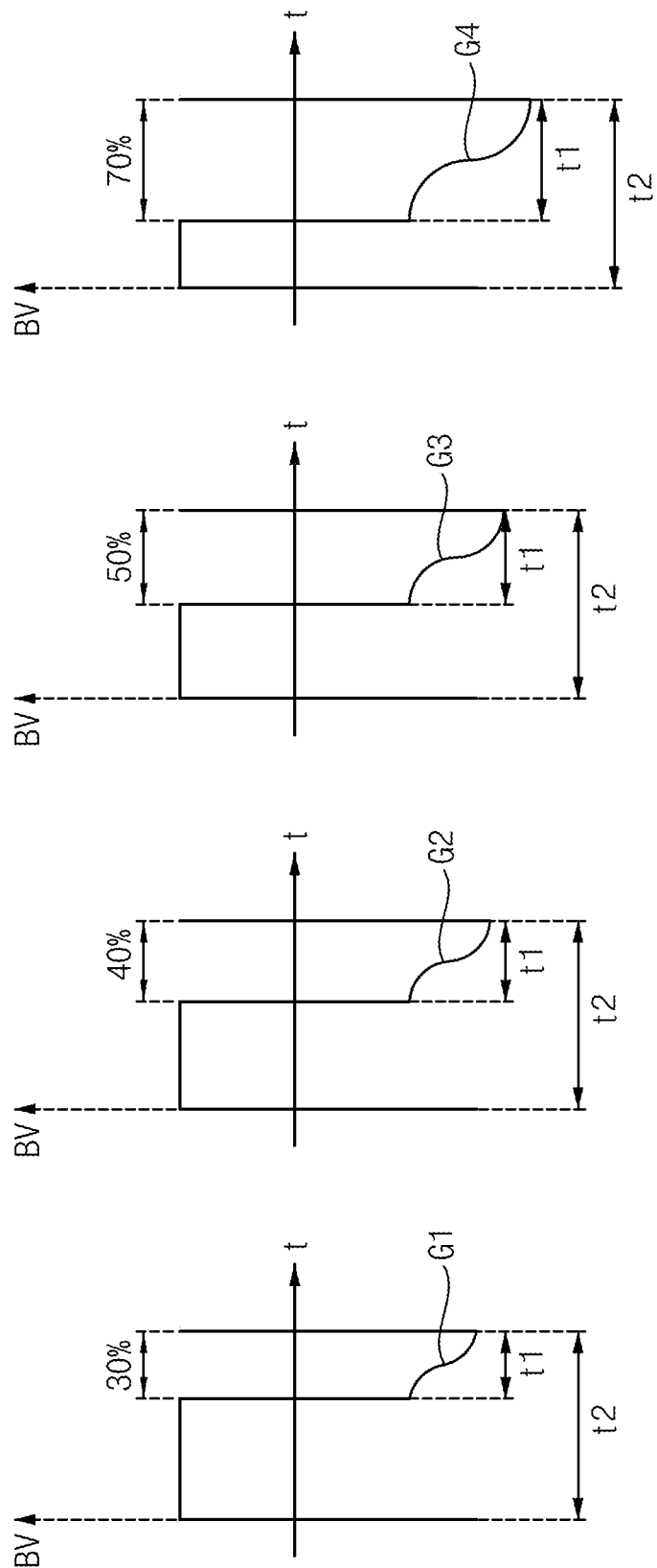
Figure 12C:
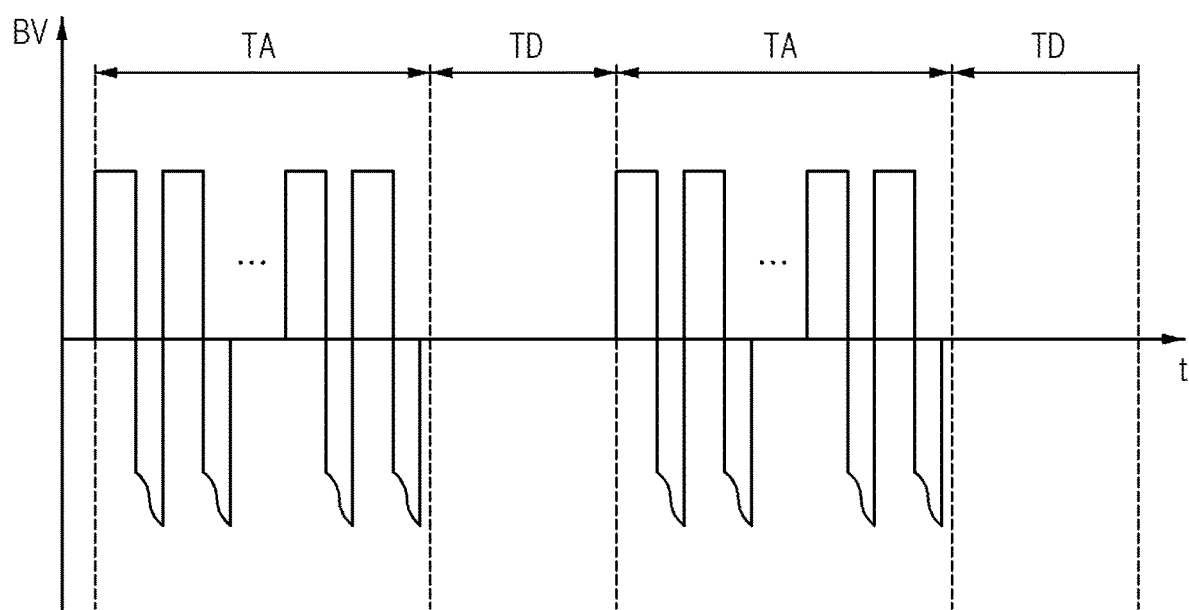

Referring to FIGS. 12A, 12B and 12C, at least one of the starting and ending voltage levels VLS and VLE of the variable voltage level VVL in the ramp interval T1, a ratio of the length of the ramp interval T1 and the length of the pulse interval T3, and a ratio of a length of a first interval in which the bias power BV is activated and a length of a second interval in which the bias power BV is deactivated may be additionally adjusted.

In some example embodiments, as illustrated in FIG. 12A, an ion energy distribution on the substrate W may be controlled by the starting and ending voltage levels VLS and VLE of the variable voltage level VVL in the ramp interval T1. The starting and ending voltage levels VLS and VLE of the variable voltage level VVL in the ramp interval T1 may be selected such that the ion energy distribution has a narrow single peak. For example, a graph P3 may be selected from among the graphs P1, P2, P3 and P4 in FIG. 12A. The starting and ending voltage levels VLS and VLE of the variable voltage level VVL in the ramp interval T1 may be adjusted to thereby control the ion energy distribution on the surface of the substrate W.

In some example embodiments, as illustrated in FIG. 12B, the ratio of the length of the ramp interval T1 and the length of the pulse interval T3 in the bias power BV, e.g., a time ratio (e.g., t1/t2) of the ramp interval T1 to a cycle of the bias power BV within one period/cycle of the bias power BV, or simply the duration ratio of the ramp interval T1 to a cycle of the bias power BV, may be adjusted. For example, the duration ratio of the ramp interval T1 to the corresponding period/cycle may be adjusted within a range of about 20% to about 80%. For example, a graph G1 represents a case that the duration ratio of the ramp interval T1 is adjusted about 30%, a graph G2 represents a case that the duration ratio of the ramp interval T1 is adjusted about 40%, a graph G3 represents a case that the duration ratio of the ramp interval T1 is adjusted about 50%, and a graph G4 represents a case that the duration ratio of the ramp interval T1 is adjusted about 70%.

In some example embodiments, as illustrated in FIG. 12C, a ratio of a length of a first interval TA in which the bias power BV is activated and a length of a second interval TD in which the bias power BV is deactivated, e.g., an on/off duty ratio of the bias power BV within a process period/cycle, may be adjusted. For example, the ratio of the length of the first interval TA and the length of the second interval TD may be adjusted within a range of about 5% to about 95%. The ratio of the length of the first interval TA and the length of the second interval TD may be adjusted to thereby remove efficiently a gas and process by-products within a pattern (opening) formed during an etching process.

Figure 13:
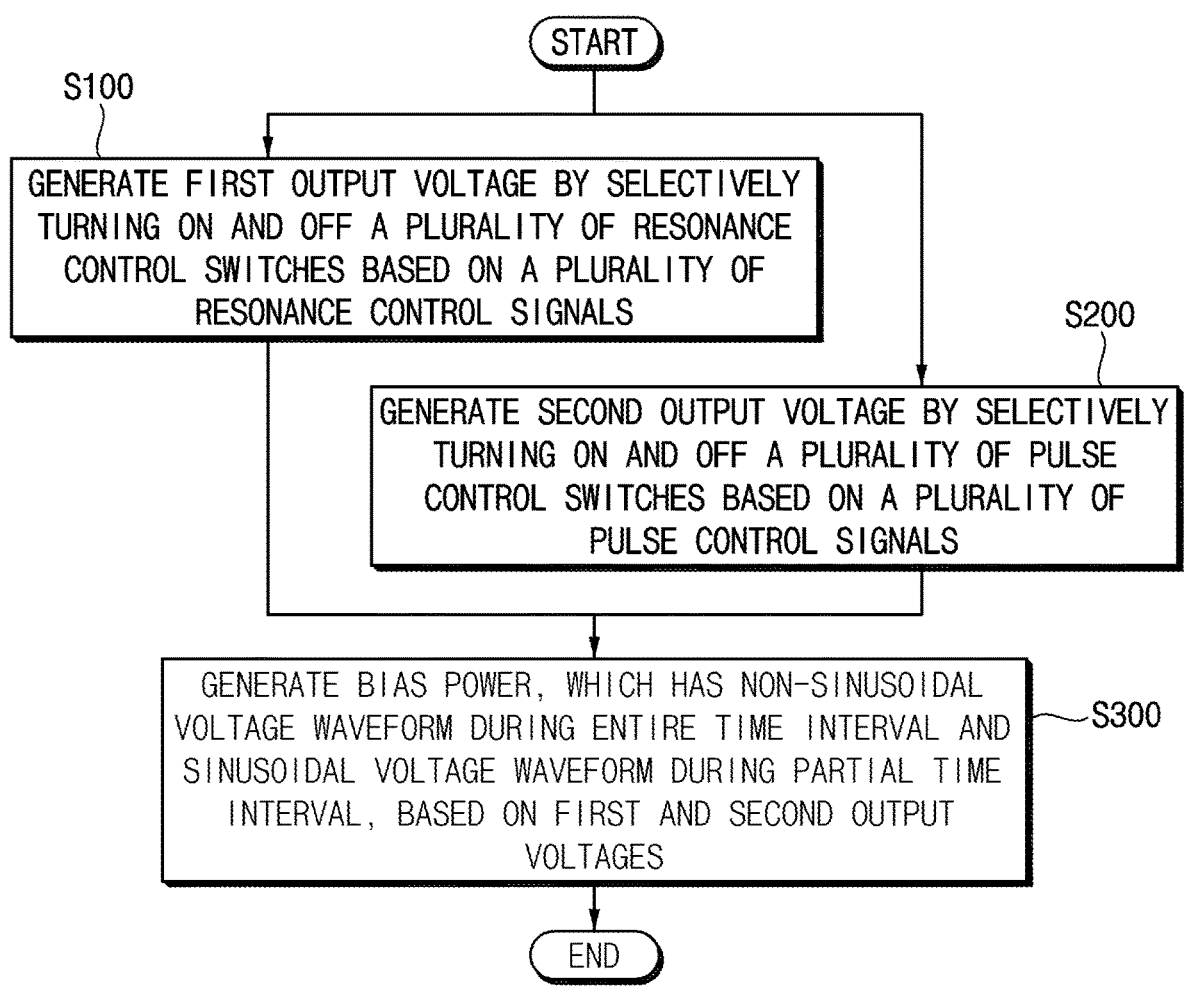
FIG. 13 is a flowchart illustrating a method of generating a power with partial sinusoidal waveform according to example embodiments.

FIG. 13 is a flowchart illustrating a method of generating a power with partial sinusoidal waveform according to example embodiments.

Referring to FIGS. 4, 5, 6, 7A, 7B, 7C and 13, in a method of generating a power with partial sinusoidal waveform according to example embodiments, the first output voltage VOUT1 is generated by selectively turning on and off the plurality of resonance control switches based on the plurality of resonance control signals RCONT (operation S100). The second output voltage VOUT2 is generated by selectively turning on and off the plurality of pulse control switches based on the plurality of pulse control signals PCONT (operation S200). The bias power BV is generated based on the first and second output voltages VOUT1 and VOUT2 (operation S300). Operations S100, S200 and S300 may be performed by the resonance module circuit 110, the pulse module circuit 120 and the plasma load 140, and may be substantially simultaneously or concurrently performed.

As described above, the bias power BV may have a non-sinusoidal voltage waveform during an entire time interval (e.g., may have an overall non-sinusoidal voltage waveform) and a sinusoidal voltage waveform during a partial time interval. For example, during the ramp interval T1, the voltage level of the bias power BV may decrease according to the sinusoidal voltage waveform without decreasing linearly. For example, the frequency of the bias power BV may be changed by adjusting at least one of the length of the ramp interval T1, the length of the first transition interval T2, the length of the pulse interval T3, and the length of the second transition interval T4. Alternatively or additionally, the frequency of the bias power BV may be changed for each step in the process of manufacturing the semiconductor device, and the frequency of the bias power BV may be changed in real time during the process. Alternatively or additionally, the amplitude of the bias power BV may also be changed.

Figure 14:
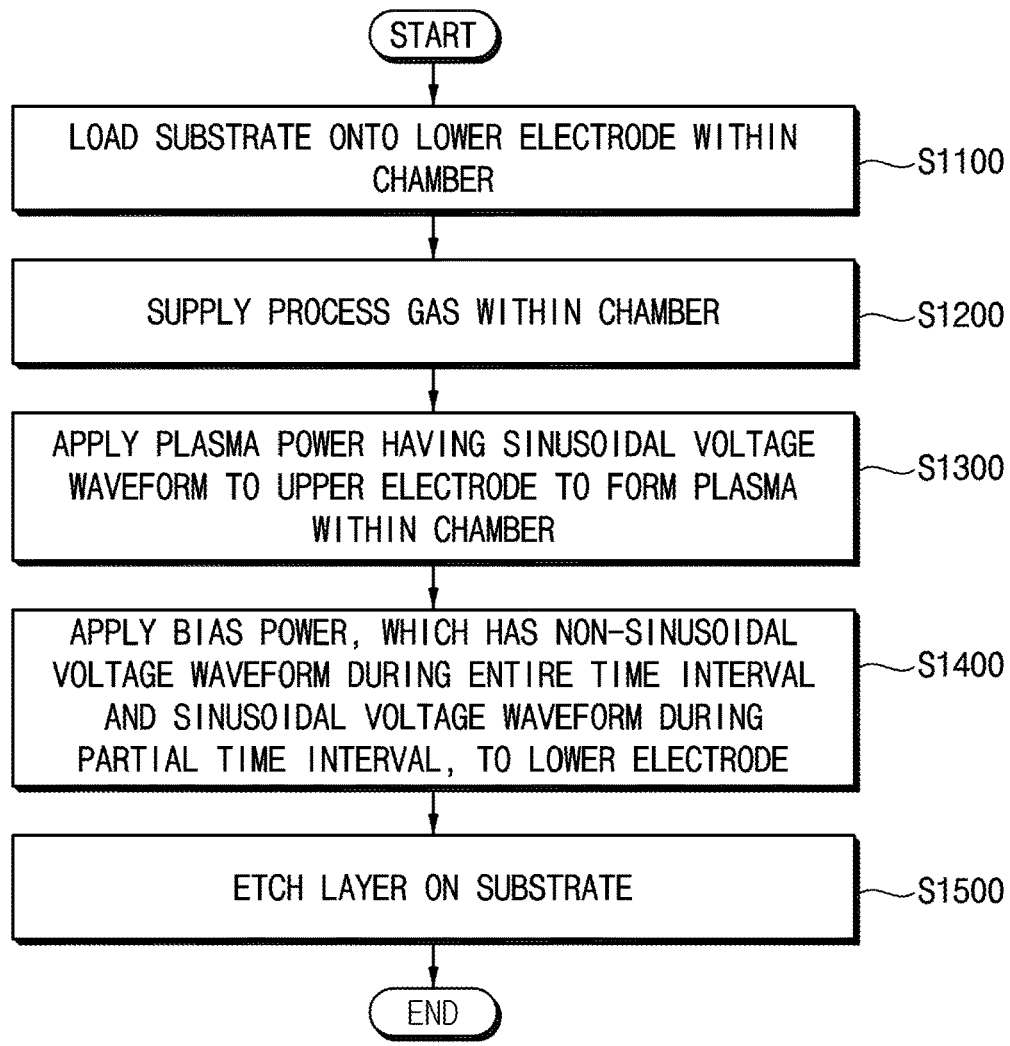
FIG. 14 is a flowchart illustrating a method of performing plasma processing according to example embodiments.

FIG. 14 is a flowchart illustrating a method of performing plasma processing according to example embodiments.

Referring to FIGS. 1, 2 and 14, in a method of performing plasma processing according to example embodiments, the substrate W is loaded onto the lower electrode 40 within the chamber 20 (operation S1100). A process gas is supplied within the chamber 20 (operation S1200).

For example, the substrate W such as the semiconductor wafer may be loaded on the electrostatic chuck 30 of the substrate stage within the chamber 20. The process gas (for example, an etching process gas) may be introduced into the chamber 20 through the gas supply lines 60a and 60b, and then a pressure of the chamber 20 may be controlled to a desired/predetermined vacuum level by the gas exhaust unit 26.

After that, the plasma power PV is applied by the sinusoidal power generator 51 to the upper electrode 50 to form the plasma within the chamber 20 (operation S1300). The plasma power PV has the sinusoidal waveform. The bias power BV is applied by the power generator 41 with partial sinusoidal waveform to the lower electrode 40 (operation S1400). The bias power BV may have a non-sinusoidal voltage waveform during an entire time interval and a sinusoidal voltage waveform during a partial time interval. An etching process is performed on the layer on the substrate W (operation S1500). Operation S1400 may be performed based on the method of generating the power with partial sinusoidal waveform according to example embodiments described with reference to FIG. 13.

For example, when the plasma power PV having the fixed frequency (for example, about 13.56 MHz) and the sinusoidal voltage waveform is applied from the sinusoidal power generator 51 to the upper electrode 50, an electromagnetic field induced by the upper electrode 50 may be applied to a source gas within the chamber 20 to generate the plasma. For example, when the bias power BV, which has a non-sinusoidal voltage waveform during an entire time interval and a sinusoidal voltage waveform during a partial time interval, is applied from the power generator 41 with partial sinusoidal waveform to the lower electrode 40, the ion energy distribution having a relatively narrow single peak may be generated on the surface of the substrate W. Thus, a controllability of an etching profile may be improved. For example, the layer on the substrate W may include at least one of a metal layer, a metal nitride layer, an insulation layer, a semiconductor layer, etc. Alternatively, the layer on the substrate W may be omitted, and the substrate W may be a layer to be etched, for example during an etch of a silicon substrate.

Figure 15:
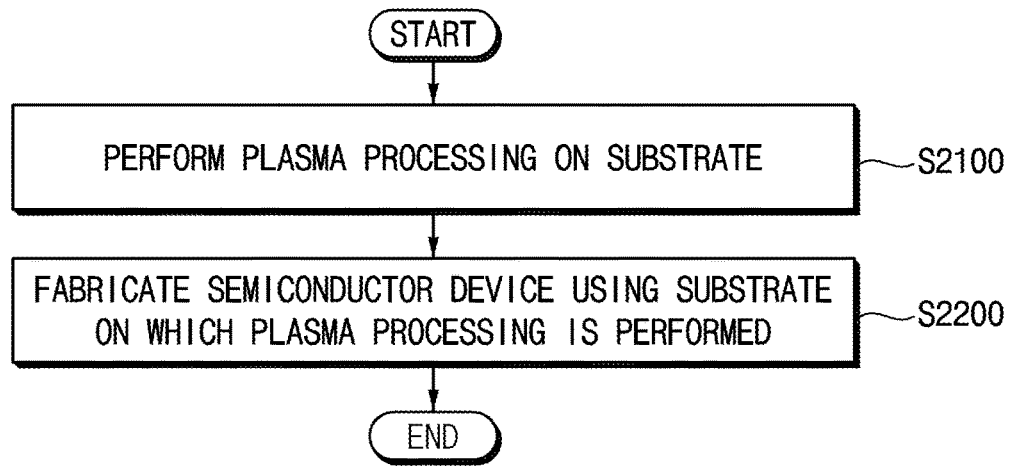
FIG. 15 is a flowchart illustrating a method of manufacturing a semiconductor device according to example embodiments.

FIG. 15 is a flowchart illustrating a method of manufacturing a semiconductor device according to example embodiments.

Referring to FIGS. 1 and 15, in a method of manufacturing a semiconductor device according to example embodiments, the plasma processing is performed on the substrate W (operation S2100). The semiconductor device is fabricated using the substrate W on which the plasma processing is performed (operation S2200). Operation S2100 may be performed based on the method of performing the plasma processing according to example embodiments described with reference to FIG. 14. For example a number of additional processes may be performed after performing a plasma process in step S2100, such as additional plasma processes, various deposition processes, and a singulation (e.g., cutting) process to result in a semiconductor device such as a semiconductor chip (e.g., memory chip or logic chip). Further processes may be performed such as placing a semiconductor chip on a package substrate and performing bonding steps to fabricate a semiconductor device such as a semiconductor package.

As will be appreciated by those skilled in the art, aspects of the inventive concept may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

The inventive concept may be applied to various semiconductor devices and manufacturing processes of the semiconductor devices. For example, the inventive concept may be applied to the manufacturing processes of the semiconductor devices such as a memory device, a processing device, etc. For example, the inventive concept may be applied to the manufacturing processes of systems including the memory device and the processing device such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, an automotive, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A power generator for generating a partial sinusoidal waveform, comprising:
a resonance module circuit including a plurality of resonance control switches, and configured to generate a first output voltage by selectively turning on and off the plurality of resonance control switches based on a plurality of resonance control signals; and
a pulse module circuit including a plurality of pulse control switches, and configured to generate a second output voltage by selectively turning on and off the plurality of pulse control switches based on a plurality of pulse control signals,
wherein the power generator is configured to generate a bias power based on the first output voltage and the second output voltage,
wherein the bias power has an overall periodic non-sinusoidal voltage waveform, and a sinusoidal voltage waveform during a partial time interval of each period of the non-sinusoidal voltage waveform,
wherein each period of the non-sinusoidal voltage waveform has a first interval in which the bias power has the sinusoidal voltage waveform and a pulse interval in which the bias power has a fixed voltage level that is fixed for a period of time, and
wherein the first interval is a ramp interval, in which the bias power has a variable voltage level that is equal to or lower than a reference voltage level and decreases according to the sinusoidal voltage waveform, and in the pulse interval the bias power has the fixed voltage level that is higher than the reference voltage level, and each period of the non-sinusoidal voltage waveform further includes a first transition interval for changing the ramp interval to the pulse interval, and a second transition interval for changing the pulse interval to the ramp interval.

2. The power generator of claim 1, wherein the variable voltage level includes a starting voltage level equal to the reference voltage level, a middle voltage level lower than the starting voltage level, and an ending voltage level lower than the middle voltage level.

3. The power generator of claim 1, wherein the resonance module circuit includes:
a first voltage source connected to a first node, and configured to determine a starting voltage level of the variable voltage level;
a second voltage source connected between the first node and a second node, and configured to determine a middle voltage level of the variable voltage level;
a third voltage source connected between the second node and a third node, and configured to determine an ending voltage level of the variable voltage level; and
an energy recovery circuit connected to the first node, the second node, and an output node outputting the bias power.

4. The power generator of claim 3, wherein the energy recovery circuit includes:
a first resonance control switch connected between the second node and a fourth node;
an inductor connected between the fourth node and a fifth node;
a capacitor connected between the fifth node and the first node; and
a second resonance control switch connected between the fifth node and the output node.

5. The power generator of claim 4, wherein the pulse module circuit includes:

a first pulse control switch connected between the third node and the output node; and a second pulse control switch connected between the output node and the first voltage source.

6. The power generator of claim 5, wherein, during the ramp interval, the first and second resonance control switches are turned on, and the first and second pulse control switches are turned off, wherein, during the first transition interval, the first and second resonance control switches are maintained at a turn-on state, the first pulse control switch is turned on, and the second pulse control switch is maintained at a turn-off state, wherein, during the pulse interval, the first and second resonance control switches are turned off, the first pulse control switch is turned off, and the second pulse control switch is turned on, and wherein, during the second transition interval, the first and second resonance control switches are turned on, the first pulse control switch is maintained at a turn-off state, and the second pulse control switch is turned off.

7. The power generator of claim 6, wherein the second resonance control switch and the first pulse control switch are turned off at a starting time point of the pulse interval, and wherein the first resonance control switch is turned off at a first time point at which a predetermined time has elapsed from the starting time point of the pulse interval.

8. The power generator of claim 7, wherein the first time point is a time point at which an inductor current flowing through the inductor becomes zero.

9. The power generator of claim 5, wherein a length of the pulse interval is changeable by adjusting a turn-on timing of the second pulse control switch.

10. The power generator of claim 4, wherein a length of the ramp interval is changeable by adjusting at least one of an inductance of the inductor and a capacitance of the capacitor.

11. The power generator of claim 10, wherein the length of the ramp interval increases as the inductance of the inductor increases or as the capacitance of the capacitor increases.

12. The power generator of claim 10, wherein the inductor is a variable inductor where the inductance is changeable.

13. The power generator of claim 10, wherein the capacitor is a variable capacitor where the capacitance is changeable.

14. The power generator of claim 3, wherein a voltage level of the bias power is changeable by adjusting at least one of the first voltage source, the second voltage source, and the third voltage source.

15. The power generator of claim 1, wherein a frequency of the bias power is changeable by adjusting at least one of a length of the ramp interval, a length of the pulse interval, a length of the first transition interval, and a length of the second transition interval.

16. The power generator of claim 11, further comprising:

a control signal generator configured to generate the plurality of resonance control signals and the plurality of pulse control signals.

17. A plasma processing apparatus comprising:

a chamber;

a substrate stage configured to support a substrate within the chamber, and including a lower electrode;

an upper electrode over the lower electrode to face the substrate;

a sinusoidal power generator configured to apply a plasma power to the upper electrode to form plasma within the chamber, the plasma power having a sinusoidal voltage waveform; and a power generator for generating a partial sinusoidal waveform and configured to apply a bias power to the lower electrode, wherein the power generator includes:

a resonance module circuit including a plurality of resonance control switches, and configured to generate a first output voltage by selectively turning on and off the plurality of resonance control switches based on a plurality of resonance control signals; and a pulse module circuit including a plurality of pulse control switches, and configured to generate a second output voltage by selectively turning on and off the plurality of pulse control switches based on a plurality of pulse control signals, wherein the power generator is configured to generate the bias power based on the first output voltage and the second output voltage, wherein the bias power has an overall periodic non-sinusoidal voltage waveform and a sinusoidal voltage waveform during a partial time interval of each period of the non-sinusoidal voltage waveform, wherein each period of the non-sinusoidal voltage waveform has a ramp interval in which the bias power has the sinusoidal voltage waveform and a pulse interval in which the bias power has a fixed voltage level that is fixed for a period of time, and wherein in the ramp interval, the bias power has a variable voltage level that is equal to or lower than a reference voltage level and decreases according to the sinusoidal voltage waveform, and in the pulse interval the bias power has the fixed voltage level that is higher than the reference voltage level, and each period of the non-sinusoidal voltage waveform further includes a first transition interval for changing the ramp interval to the pulse interval, and a second transition interval for changing the pulse interval to the ramp interval.

18. The plasma processing apparatus of claim 17, configured such that:

the bias power can be set to have a first frequency and a first amplitude, during a first step in a process of manufacturing a semiconductor device, and the bias power can be set to have a second frequency different from the first frequency and a second amplitude different from the first amplitude, during a second step different from the first step in the process of manufacturing the semiconductor device.

19. A power generator for generating a partial sinusoidal waveform, comprising:

a resonance module circuit including a first resonance control switch, an inductor, a second resonance control switch and a capacitor, and configured to generate a first output voltage by selectively turning on and off the first resonance control switch and the second resonance control switch based on a first resonance control signal and a second resonance control signal, respectively, the first resonance control switch, the inductor and the second resonance control switch being connected between a first node and an output node, the capacitor being connected to the inductor;

a pulse module circuit including a first pulse control switch and a second pulse control switch that are connected to the output node, and configured to generate a second output voltage by selectively turning on and off the first pulse control switch and the second pulse control switch based on a first pulse control signal and a second pulse control signal, respectively; and a control signal generator configured to generate the first resonance control signal, the second resonance control signal, the first pulse control signal and the second pulse control signal, wherein the power generator is configured to generate a bias power based on the first output voltage, and the second output voltage, wherein the bias power has a non-sinusoidal voltage waveform during an entire time interval and a sinusoidal voltage waveform during a partial time interval of the entire time interval, wherein the bias power has a voltage waveform that repeats every period, and wherein the period includes a ramp interval in which the bias power has a variable voltage level that is equal to or lower than a reference voltage level and decreases according to the sinusoidal voltage waveform, a pulse interval in which the bias power has a fixed voltage level that is higher than the reference voltage level, a first transition interval for changing the ramp interval to the pulse interval, and a second transition interval for changing the pulse interval to the ramp interval.

* * * * *